United States Patent
Watanabe et al.

(10) Patent No.: US 9,372,404 B2
(45) Date of Patent: Jun. 21, 2016

(54) ORGANIC FILM COMPOSITION, METHOD FOR FORMING ORGANIC FILM AND PATTERNING PROCESS USING THIS, AND HEAT-DECOMPOSABLE POLYMER

(71) Applicant: SHIN-ETSU CHEMICAL CO., LTD., Tokyo (JP)

(72) Inventors: Takeru Watanabe, Jyoetsu (JP); Seiichiro Tachibana, Jyoetsu (JP); Toshihiko Fujii, Jyoetsu (JP); Kazumi Noda, Jyoetsu (JP); Toshiharu Yano, Jyoetsu (JP); Takeshi Kinsho, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 138 days.

(21) Appl. No.: 13/873,685

(22) Filed: Apr. 30, 2013

(65) Prior Publication Data

US 2013/0302990 A1 Nov. 14, 2013

(30) Foreign Application Priority Data

May 8, 2012 (JP) ................................ 2012-107102

(51) Int. Cl.
G03F 7/11 (2006.01)
H01L 21/027 (2006.01)
G03F 7/09 (2006.01)
H01L 21/308 (2006.01)
H01L 21/311 (2006.01)

(52) U.S. Cl.
CPC ............ *G03F 7/094* (2013.01); *H01L 21/3081* (2013.01); *H01L 21/0271* (2013.01); *H01L 21/31116* (2013.01); *H01L 21/31138* (2013.01)

(58) Field of Classification Search
None
See application file for complete search history.

(56) References Cited

U.S. PATENT DOCUMENTS

| | | | |
|---|---|---|---|
| 5,562,653 A * | 10/1996 | Thompson | .................. 604/890.1 |
| 2002/0106909 A1 | 8/2002 | Kato et al. | |
| 2002/0198277 A1 * | 12/2002 | Sezi | .............................. 521/134 |
| 2005/0255712 A1 | 11/2005 | Kato et al. | |
| 2009/0274978 A1 | 11/2009 | Ohashi et al. | |
| 2009/0311624 A1 | 12/2009 | Horiguchi et al. | |

(Continued)

FOREIGN PATENT DOCUMENTS

| | | | |
|---|---|---|---|
| GB | 1076360 A | * | 7/1967 |
| JP | A-2002-334869 | | 11/2002 |

(Continued)

OTHER PUBLICATIONS

Kobayashi et al "Microporous materials derived from two- and three-dimensional hyperbranched conjugated polymers by thermal elimination of substituents", Journal of Materials Chemistry, year 2007, vol. 17, pp. 4286-4296, obtained from www.rsc.org.materials and the Royal Society of CHemstry.*

(Continued)

*Primary Examiner* — Cynthia Hamilton
(74) *Attorney, Agent, or Firm* — Oliff PLC

(57) ABSTRACT

The invention provides an organic film composition comprises (A) a heat-decomposable polymer, (B) an organic solvent, and (C) an aromatic ring containing resin, with the weight reduction rate of (A) the heat-decomposable polymer from 30° C. to 250° C. being 40% or more by mass. There can be provided an organic film composition having not only a high dry etching resistance but also an excellent filling-up or flattening characteristics.

27 Claims, 3 Drawing Sheets

(56) References Cited

U.S. PATENT DOCUMENTS

| | | |
|---|---|---|
| 2010/0022090 A1 | 1/2010 | Sakaguchi et al. |
| 2010/0099044 A1 | 4/2010 | Hatakeyama et al. |
| 2011/0177459 A1 | 7/2011 | Ogihara et al. |
| 2012/0064725 A1 | 3/2012 | Kinsho et al. |
| 2012/0168728 A1* | 7/2012 | Hawker et al. ............ 257/40 |
| 2015/0221500 A1* | 8/2015 | Ogihara ............ H01L 21/02068 134/19 |

FOREIGN PATENT DOCUMENTS

| | | |
|---|---|---|
| JP | 2003-119281 A | 4/2003 |
| JP | A-2004-205685 | 7/2004 |
| JP | A-2007-199653 | 8/2007 |
| JP | A-2009-269953 | 11/2009 |
| JP | 2010-064904 A | 3/2010 |
| JP | 2010-138369 A * | 6/2010 |
| JP | 2011-150023 A | 8/2011 |
| JP | B2-4784784 | 10/2011 |
| JP | 2012-077295 A | 4/2012 |
| TW | 201030470 A | 8/2010 |
| WO | WO 2004/066377 A1 | 8/2004 |
| WO | 2008069047 A1 | 6/2008 |

OTHER PUBLICATIONS

R.L. Zimmerman et al "Vinyl Ethers of diethylene glycol", I & EC Product Research and Development, vol. 2, No. 4, Dec. 1963, pp. 296-303.*

Hashimoto et al "Synthesis of Polyacetals with Various Main-Chain Structures by the Self-Polyaddition of Vinyl Ethers with a Hydroxyl Function", Jouranl of POlymer Science: Part A: Polymer Chemistry, vol. 40, pp. 4053-4064 year 2002. from Wiley Periodicals, Inc.*

English translation of JP, 2010-138369, A (2010) from machine translation from AIPN Japan Patent Office National Center for Industrial Property Information and Training, generated Nov. 18, 5012, 28 pages.*

English abstract of SU 1082790 a , inventor name: Limanov et al, issued Mar. 30, 1984, with Accession No. 1984:533765 amd CAN 101:133765 frp, SciFinder database, 2 pages.*

Aug. 21, 2015 Office Action issued in Taiwanese Application No. 102116107.

Dec. 22, 2015 Office Action issued in Japanese Patent Application No. 2013-062179.

* cited by examiner (A)

(B)

(C)

(D)

(E)

(F)

(G)

(H)

(I)

(J)

(K)

ORGANIC FILM COMPOSITION, METHOD FOR FORMING ORGANIC FILM AND PATTERNING PROCESS USING THIS, AND HEAT-DECOMPOSABLE POLYMER

BACKGROUND OF THE INVENTION

1. Field of the Invention

The present invention relates to: an organic film composition, especially an organic film composition for a resist underlayer film composition or for a flattening composition useful in a multilayer resist process for microprocessing in manufacturing of a semiconductor device and so on; a method for forming an organic film by using the composition; a resist patterning process by using the composition; and a heat-decomposable polymer used in them.

2. Description of the Related Art

As an LSI advances toward higher integration and higher processing speed, miniaturization of a pattern size is rapidly progressing. In accordance with this miniaturization move, the lithography technology therein has achieved formation of a miniaturized pattern by shifting the wavelength of a light source shorter and by proper selection of a resist composition for such a light source. The main stream of this is a positive photoresist composition used in a monolayer. In this monolayer positive photoresist composition, a resist mechanism is constructed such that a skeleton having an etching resistance to dry etching by a gas plasma of a chlorine type or a fluorine type is incorporated into a resist resin, and that an exposed part thereof is dissolved, so that a pattern may be formed by dissolving the exposed part, and then a substrate to be processed may be dry etched by using the remained resist pattern as an etching mask.

However, if miniaturization is pursued without changing a film thickness of the photoresist film to be used, or in other words, if the pattern width thereof is made further narrower, the resolution of the photoresist film is decreased. In addition, when the photoresist film is pattern-developed by a developing solution, a so-called aspect ratio thereof is so large that a phenomenon of the pattern fall occurs. In view of the above-mentioned, film thickness of the photoresist film has been made thinner in accordance with this miniaturization move.

On the other hand, for processing of a substrate to be processed, the method wherein this substrate is dry etched by using a photoresist film having a formed pattern as an etching mask has been usually used. However, practically there is no dry etching method having a complete selectivity between the photoresist film and the substrate to be processed; and thus, during processing of the substrate, the resist film is damaged whereby causing collapse of the resist film during the time of processing of the substrate so that the resist pattern cannot be transferred precisely to the substrate to be processed. Because of this, the resist composition has been required to have a further higher dry etching resistance in accordance with the move to a finer pattern. Also, because of the shift of the exposure light to a shorter wavelength, a resin used for the photoresist composition is required to have a smaller light absorbance at the wavelength of the exposure light, so that, in accordance with the move to i-beam, KrF, and ArF, the resin has been shifting to a novolak resin, polyhydroxystyrene, and a resin having an aliphatic polycyclic skeleton. Practically however, the etching rate under the dry etching condition mentioned above is increasing so that recent photoresist compositions having a high resolution tend to have rather a lower etching resistance.

In the situation as mentioned above, a substrate to be processed must be dry etched by using a photoresist film having a thinner thickness and a lower etching resistance than ever; and thus, securement of a material and a process in this patterning process has become imperative.

One means to solve the problems mentioned above is a multilayer resist method. In this method, a middle layer film having the etching selectivity different from that of a resist upper layer film, i.e., a photoresist film, is put between the resist upper layer film and a substrate to be processed; and after a pattern is formed on the resist upper layer film, this pattern is transferred to the middle layer film by using the pattern on the upper layer film as a dry etching mask, and then the pattern is transferred further to the substrate to be processed by dry etching by using the middle layer film as a dry etching mask.

One of the multilayer resist methods is a three-layer resist method in which a general resist composition used in a monolayer resist method can be used. For example, an organic film formed of a novolak resin and the like is formed on the substrate to be processed as the resist underlayer film, on it is formed a silicon-containing film as the resist middle layer film, and further on it is formed a usual organic photoresist film as the resist upper layer film. Because the organic resist upper layer film can have a good selectivity relative to the silicon-containing resist middle layer film in dry etching by a fluorine gas plasma, the resist pattern can be transferred to the silicon-containing resist middle layer film by using dry etching by the fluorine gas plasma. According to this method, even if a resist composition with which a pattern having a sufficient film thickness to directly work on the substrate to be processed is difficult to be formed is used, or a resist composition whose dry etching resistance is insufficient to work on the substrate is used, the pattern can be transferred to the silicon-containing film, and then, by transferring the pattern by dry etching using an oxygen gas plasma, the novolak film pattern having a sufficient dry etching resistance for processing can be obtained.

Many technologies as to the organic underlayer film as mentioned above have been in the public domain for example, Patent Document 1). In recent years, however, a need of excellent filling-up or flattening characteristics, in addition to the dry etching characteristics, is increasing. For example, if there is a very fine pattern structure such as a hole and a trench on the underlayment substrate to be processed, the filling-up characteristic to fill up inside the pattern by a film without a void became necessary. Further, if there is a difference in the levels on the underlayment substrate to be processed, or a dense pattern area and a scarce pattern area co-exist on the same wafer, surface of the film needs to be flattened by the underlayer film. By flattening the underlayer film surface, variance of the film thickness of the middle layer film and the photoresist to be formed thereupon can be suppressed; and as a result, a focus margin of the lithography and a margin in the subsequent process steps of the substrate to be processed can be enlarged.

As to the means to improve the filling-up and flattening characteristics of the underlayer film composition, addition of a liquid additive such as a polyether polyol has been proposed (Patent Document 2). However, the organic film formed by this method contains a large quantity of the polyether polyol unit which is poor in the etching resistance thereby decreasing the etching resistance significantly; and thus, this is not suitable as the underlayer film for the three-layer resist process. As discussed above, the resist underlayer film composition having both the sufficient etching resistance and the excellent filling-up and flattening characteristics, as well as a patterning process using this, is wanted.

In addition, use of the organic film composition having excellent filling-up and flattening characteristics is not limited to the underlayer film for the three-layer resist process, but it can be used widely as a flattening material in the manufacturing process of a semiconductor, for example, as a material to flatten the substrate in advance of patterning by nanoimprinting. Currently, the CMP process is generally used for global flattening in the manufacturing process of a semiconductor; but the CMP process is costly so that this material receives a high hope for the global flattening method that displaces the CMP process.

PRIOR ART DOCUMENTS

Patent Documents

Patent Document 1: Japanese Patent Laid-Open Publication No. 2004-205685
Patent Document 2: Japanese Patent No. 4784784

SUMMARY OF THE INVENTION

The present invention was made in view of the situation mentioned above, and has an object to provide an organic film composition having both the high dry etching resistance and the excellent filling-up or flattening characteristics.

To solve the problems mentioned above, the present invention provides an organic film composition comprising (A) a heat-decomposable polymer, (B) an organic solvent, and (C) an aromatic ring containing resin, with the weight reduction rate of (A) the heat-decomposable polymer from 30° C. to 250° C. being 40% or more by mass.

When the organic film composition like this is used, residual amount of (A) the heat-decomposable polymer in the film after film formation by heating is so small that a large quantity of the component (namely, the component (A)) contributing to increase filling-up and flattening characteristics can be blended without adversely affecting the excellent etching resistance of (C) the aromatic ring containing resin; and as a result, both the high etching characteristics and the excellent filling-up and flattening characteristics can be obtained simultaneously.

In this case, (A) the heat-decomposable polymer is preferably in the state of liquid at 100° C. with the weight reduction rate thereof from 30° C. to 250° C. being preferably 70% or more by mass.

When the organic film composition like this is used, residual amount of (A) the heat-decomposable polymer in the film after film formation by heating becomes further smaller so that the adverse effect to the excellent etching resistance of the aromatic ring containing resin (C) can be further suppressed; and thus, an arbitrary quantity of the component (A) can be blended therein. In addition, fluidity of the organic film composition can be increased, so that further improvement in the filling-up and flattening characteristics can be realized.

In addition, it is preferable that (A) the heat-decomposable polymer contain a repeating unit having an acetal structure shown by the following general formula (1),

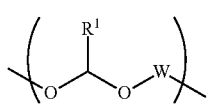

(1)

wherein $R^1$ represents a hydrogen atom, or an optionally substituted, saturated or unsaturated monovalent organic group having 1 to 30 carbon atoms. W represents a saturated or unsaturated divalent organic group having 2 to 30 carbon atoms.

Because of the chain repeating unit, (A) the heat-decomposable polymer has the high fluidity, so that the organic film composition like this can be provided with an especially excellent filling-up and flattening characteristics. In addition, (A) the heat-decomposable polymer can be provided with an appropriate heat-decomposition property owing to the repeating unit having the acetal structure shown by the general formula (1).

In addition, it is preferable that (A) the heat-decomposable polymer comprise one or more compounds shown by the following general formulae (1a) to (1c),

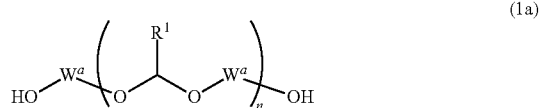

(1a)

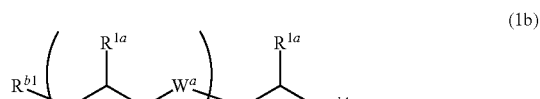

(1b)

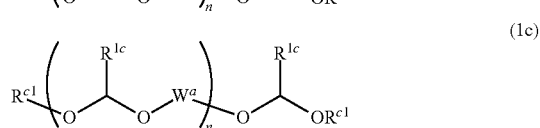

(1c)

wherein $R^{1a}$ represents an alkyl group having 1 to 4 carbon atoms. $W^a$ represents a saturated or unsaturated divalent hydrocarbon group having 4 to 10 carbon atoms and optionally containing an ether bond. Each of $R^{b1}$ independently represents —$W^a$—OH, or an optionally substituted, saturated or unsaturated monovalent organic group having 1 to 30 carbon atoms. $R^{1c}$ represents a hydrogen atom, an optionally substituted aryl group having 6 to 20 carbon atoms, or a heteroaryl group having 4 to 20 carbon atoms. Each of $R^{c1}$ independently represents an alkyl group having 1 to 4 carbon atoms, or —$W^a$—OH. "n" represents an average number of the repeating unit, and is in the range of 3 to 500.

If the organic film composition like this is used, (A) the heat-decomposable polymer has an excellent fluidity and is provided with an optimum heat-decomposition property; and in addition, (A) the heat-decomposable polymer can be provided with an especially excellent filling-up and flattening characteristics while maintaining various characteristics such as an etching resistance, a heat resistance, and an optical property.

In addition, it is preferable that (C) the aromatic ring containing resin contain a naphthalene ring. If the aromatic ring containing resin (C) in the organic film composition contains a naphthalene ring, it is preferable because this gives the organic film having excellent characteristics in the etching resistance, the heat resistance, the optical property, and so forth.

Further, it is preferable that (C) the aromatic ring containing resin comprise a resin (C1) that is obtained by polycondensation of any one or more compounds shown by the following general formulae (2a) and (2b) with a compound shown by the following general formula (3),

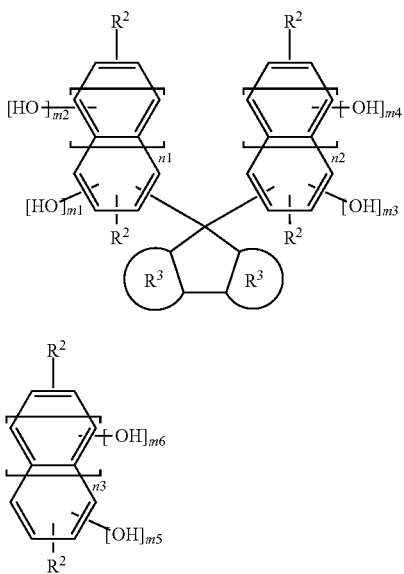

wherein each of $R^2$ independently represents a hydrogen atom, or a saturated or unsaturated hydrocarbon group having 1 to 20 carbon atoms. Each of $R^3$ independently represents a benzene ring or a naphthalene ring. Each of m1+m2, m3+m4, and m5+m6 represents 1 or 2. Each of n1, n2, and n3 represents 0 or 1, $$A\text{-CHO} \quad (3)$$

wherein A represents any of a hydrogen atom, a hydrocarbon group having 1 to 10 carbon atoms, and an optionally substituted aromatic hydrocarbon group having 6 to 20 carbon atoms.

In addition, it is preferable that (C) the aromatic ring containing resin comprise a resin (C2) that has one or more repeating units shown by the following general formula (4),

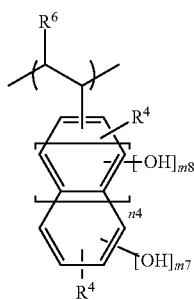

wherein each of $R^4$ independently represents a hydrogen atom, or a saturated or unsaturated hydrocarbon group having 1 to 20 carbon atoms. $R^5$ represents a hydrogen atom or may be bonded with one $R^4$ to form a ring. When $R^4$ and $R^5$ are bonded to form a ring, —$R^4$—$R^5$— represents a single bond or an alkylene group having 1 to 3 carbon atoms. Here, m7+m8 represents 0, 1, or 2, and n4 represents 0 or 1.

The organic film composition that contains the aromatic ring containing resin (C) which comprises the resin (C1) or (C2) is preferable, because the organic film thereby formed has not only excellent filling-up and flattening characteristics but also especially etching resistance and optical properties.

Further, it is preferable that (C) the aromatic ring containing resin comprise a resin (C3) that is obtained by polycondensation of one or two or more aromatic ring containing compounds with benzophenone, naphthophenone, or fluorenone.

The organic film composition that contains the aromatic ring containing resin (C) which comprises the resin (C3) is preferable, because the organic film thereby formed has not only excellent filling-up and flattening characteristics but also especially etching resistance and optical properties.

In addition, the organic film composition may further comprise at least one or more kinds selected from the group consisting of (D) a phenolic hydroxyl group containing compound, (E) an acid generator, (F) a crosslinking agent, and (G) a surfactant.

As mentioned above, the organic film composition may add to (D) a phenolic hydroxyl group containing compound, (E) an acid generator, and (F) a crosslinking agent in order to facilitate a crosslinking curing reaction, and (G) a surfactant in order to improve a coating property during the time of application by spin coating.

In addition, the organic film composition as mentioned above can be used as a resist underlayer film composition or a flattening composition for manufacturing of a semiconductor device.

Because the organic film composition has both the etching characteristics and the filling-up and flattening characteristics, this composition can be used excellently as a resist underlayer film composition or a flattening composition for manufacturing of a semiconductor device.

In addition, the present invention provides a method for forming an organic film used as a resist underlayer film or as a flattening film for manufacturing of a semiconductor device of a multilayer resist film used in a lithography, wherein the organic film is formed by applying the afore-mentioned organic film composition onto a substrate to be processed followed by heat treatment of the composition in the temperature range of 200° C. or higher to 600° C. or lower for the period of 10 to 600 seconds to effect the curing.

By using the method like this for forming the organic film, the crosslinking reaction can be facilitated, and mixing with the upper layer film can be avoided. In addition, (A) the heat-decomposable polymer in the organic film composition decomposes and evaporates by the heat treatment at 200° C. or higher; and as a result, residual matters in the film can be reduced so that deterioration of the etching resistance of the film can be suppressed.

Further, the present invention provides a method for forming an organic film used as a resist underlayer film or as a flattening film for manufacturing of a semiconductor of a multilayer resist film used in a lithography, wherein the organic film is formed by applying the afore-mentioned organic film composition onto a substrate to be processed followed by baking of the composition under an atmosphere of an oxygen concentration range of 0.1% or more to 21% or less to effect the curing.

By baking the organic film composition under the oxygen atmosphere as mentioned above, an adequately cured film can be obtained.

In addition, in the method for forming an organic film, a substrate having a structural body with a height of 30 nm or more or with different levels may be used as the substrate to be processed.

The organic film composition has excellent filling-up and flattening characteristics so that this is especially useful for forming a flattened organic film on a substrate having a structural body with a height of 30 nm or more or with different levels.

In addition, the present invention provides a patterning process on a substrate to be processed by a lithography, wherein, at least, a resist underlayer film is formed on a substrate to be processed by using the above-mentioned organic film composition, on this resist underlayer film is formed a resist middle layer film by using a resist middle layer film composition which contains a silicon atom, on this resist middle layer film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the resist middle layer film is etched by using the obtained resist pattern as an etching mask, the resist underlayer film is etched by using the obtained resist middle layer film pattern as an etching mask, and the substrate to be processed is etched by using the obtained resist underlayer film pattern as an etching mask, thereby forming a pattern on the substrate to be processed.

When the patterning process using the multilayer resist process as mentioned above is used, a fine pattern can be formed on a substrate to be processed with a high precision.

Further, the foregoing etching of the resist underlayer film by using the obtained resist middle layer film pattern as an etching mask can be carried out by using an etching gas mainly comprising an oxygen gas or a hydrogen gas.

The resist middle layer film which contains a silicon atom shows an etching resistance to an oxygen gas or a hydrogen gas; and thus, etching of the resist underlayer film by using the resist middle layer film as a mask can be carried out by using an etching gas mainly comprising an oxygen gas or a hydrogen gas.

In addition, the present invention provides a patterning process on a substrate to be processed by a lithography, wherein, at least, a resist underlayer film is formed on a substrate to be processed by using the above-mentioned organic film composition, on this resist underlayer film is formed any inorganic hard mask middle layer film selected from a silicon oxide film, a silicon nitride film, and a silicon oxynitride film, on this inorganic hard mask middle layer film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the inorganic hard mask middle layer film is etched by using the obtained resist pattern as an etching mask, the resist underlayer film is etched by using the obtained inorganic hard mask middle layer film pattern as an etching mask, and the substrate to be processed is etched by using the obtained resist underlayer film pattern as an etching mask, thereby forming a pattern on the substrate to be processed.

Further, the present invention provides a patterning process on a substrate to be processed by a lithography, wherein, at least, a resist underlayer film is formed on a substrate to be processed by using the above-mentioned organic film composition, on this resist underlayer film is formed any inorganic hard mask middle layer film selected from a silicon oxide film, a silicon nitride film, and a silicon oxynitride film, on this inorganic hard mask middle layer film is formed an organic anti-reflective film is formed, on this organic anti-reflective film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the organic anti-reflective film and the inorganic hard mask middle layer film are etched by using the obtained resist pattern as an etching mask, the resist underlayer film is etched by using the obtained inorganic hard mask middle layer film pattern as an etching mask, and the substrate to be processed is etched by using the obtained resist underlayer film pattern as an etching mask, thereby forming a pattern on the substrate to be processed.

As mentioned above, in the patterning process, an inorganic hard mask middle layer film may be formed as the middle layer film; and in addition, an organic anti-reflective film (BARC) may be formed on this middle layer film.

Further, the above-mentioned inorganic hard mask middle layer film may be formed by a CVD method or an ALD method.

In the patterning process, a combination of the inorganic hard mask middle layer film formed by a CVD method or an ALD method with the resist underlayer film formed by a spin coating method is possible.

In addition, in the Patterning process, a substrate having a structural body with a height of 30 nm or more or with different levels may be used as the substrate to be processed.

The resist underlayer film composition has excellent filling-up and flattening characteristics so that this is especially useful for forming a pattern by a multilayer resist lithography on the substrate having a structural body with a height of 30 nm or more or with different levels.

In addition, the present invention provides a heat-decomposable polymer comprising one or more compounds shown by the following general formulae (1a) to (1c),

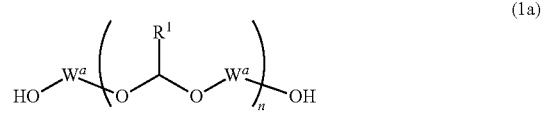

(1a)

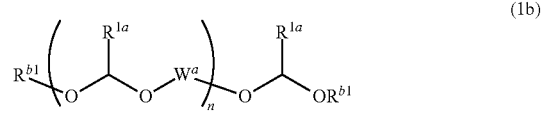

(1b)

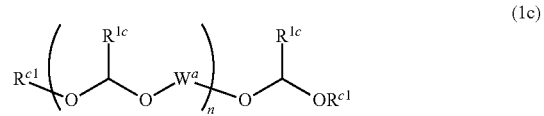

(1c)

wherein $R^{1a}$ represents an alkyl group having 1 to 4 carbon atoms. $W^a$ represents a saturated or unsaturated divalent hydrocarbon group having 4 to 10 carbon atoms optionally containing an ether bond. Each of $R^{b1}$ independently represents —$W^a$—OH, or an optionally substituted, saturated or unsaturated monovalent organic group having 1 to 30 carbon atoms. $R^{1c}$ represents a hydrogen atom, an optionally substituted aryl group having 6 to 20 carbon atoms, or a heteroaryl group having 4 to 20 carbon atoms. Each of $R^{c1}$ independently represents an alkyl group having 1 to 4 carbon atoms, or —$W^a$—OH. "n" represents an average number of the repeating unit, and is in the range of 3 to 500.

The heat-decomposable polymer, which comprises one or more compounds shown by the general formulae (1a) to (1c), can be suitably used particularly for the organic film composition, the method for forming a film, and the patterning process as mentioned above.

As explained above, the organic film composition has excellent filling-up and flattening characteristics while not adversely affecting other properties such as the etching resistance; and thus, this is extremely useful as the resist underlayer film composition for multilayer resist processes such as a silicon-containing bilayer resist process, a three-layer resist process using a silicon-containing middle layer film, and a four-layer resist process using a silicon-containing middle layer film and an organic anti-reflective film, or as a flattening composition for manufacturing of a semiconductor device.

DESCRIPTION OF THE PREFERRED EMBODIMENTS

Figure 1:
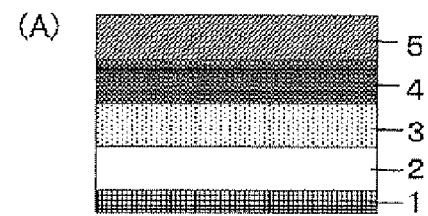
FIG. 1
This is an explanatory drawing with regard to one embodiment of the patterning process (three-layer resist process).
Figure 1:
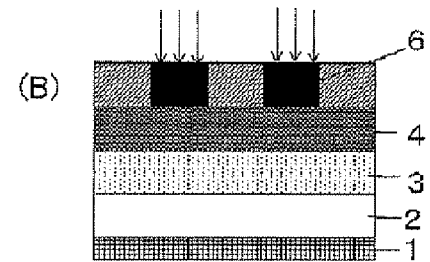
Figure 1:
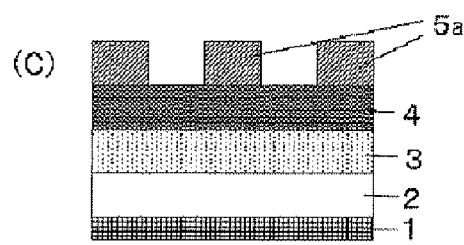
Figure 1:
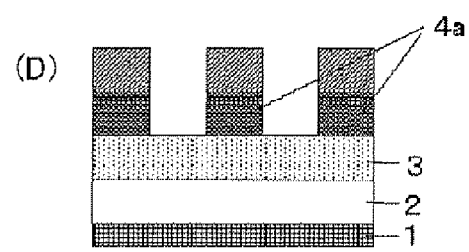
Figure 1:
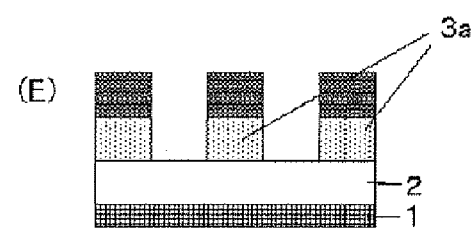
Figure 1:
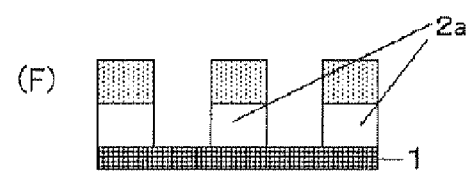

Hereunder, the present invention will be explained in more detail.

As mentioned above, the organic film composition having excellent filling-up and flattening characteristics while not adversely affecting other characteristics such as a dry etching resistance has been wanted.

Inventors explored various blending components to improve the filling-up and flattening properties. When a unimolecular compound having a low molecular weight is used, a blending effect thereof is low because of volatilization thereof. When a compound having a comparatively increased molecular weight is used, there is a certain instance that the filling-up characteristics are enhanced; but this has not been put into the practical use because this has many problems such as poor uniformity in film thickness and sublimation during film formation to cause fouling of a film-making equipment and so on. When a polymer is used, a polymer having a high carbon density whereby having a high etching resistance is generally poor in fluidity; and thus, this is poor in filling-up and flattening characteristics in many cases. On the other hand, when a polymer mainly comprising a chain structure with a low carbon density, for example, polypropylene glycol, is used, a certain enhancing effect on the filling-up characteristics can be seen; but this has failed to serve for a practical use because the etching resistance thereof, which is a vital characteristic, is drastically deteriorated.

As a result of further investigation, it was found that when a heat-decomposable polymer having a certain fluidity was blended into a film-forming composition as the component to enhance the filling-up and flattening characteristics, excellent filling-up and flattening characteristics could be obtained without adversely affecting various properties including the dry etching resistance; and based on this finding, the present invention could be completed.

1. Organic Film Composition:
That is, the organic film composition comprises (A) a heat-decomposable polymer, (B) an organic solvent, and (C) an aromatic ring containing resin, with the weight reduction rate of (A) the heat-decomposable polymer from 30° C. to 250° C. being 40% or more by mass. In this case, a preferable embodiment of (A) the heat-decomposable polymer is that the polymer is in the state of liquid at 100° C. with the weight reduction rate thereof from 30° C. to 250° C. being 70% or more by mass.

When a resist underlayer film and so on is formed, it is a general practice to carry out a post-application bake (PAB) by heating it at the temperature of 100° C. or higher as the minimum temperature for a purpose to remove a solvent and so forth; and in the present case, (A) the heat-decomposable polymer which is a liquid at 100° C. contributes greatly to enhancement of the fluidity of the film-forming composition during the time of PAB thereby enabling further enhancement of the filling-up and flattening characteristics.

Also, when a resist underlayer film and so on is formed, after the PAB or in order to simultaneously carry out the PAB, a thermal cure is generally carried out by baking it at about 250° C. or higher (hard bake) to obtain a cured film. Accordingly, if the weight reduction rate thereof from around room temperature of 30° C. to 250° C. is 40% or more by mass, after baking at 250° C. the residual amount of (A) the heat-decomposable polymer, which is poor in etching resistance, can be reduced to about 60% or less by mass, namely to about a half of the original blending amount thereof; and as a result, deterioration of the etching resistance of the obtained organic film can be suppressed to minimum. Moreover, if the weight reduction rate thereof is 70% or more by mass, after baking at 250° C. the residual amount of (A) the heat-decomposable polymer, which is poor in etching resistance, can be reduced to about 30% or less by mass relative to the original blending amount thereof; and as a result, deterioration of the etching resistance of the obtained organic film can be further reduced, and thus, this is more preferable.

On the other hand, if the weight reduction rate thereof from 30° C. to 250° C. is less than 40% by mass, 60% or more by mass of (A) the heat-decomposable polymer, which is poor in etching resistance, is estimated to be remained even after baking at 250° C.; and thus, deterioration of the etching resistance of the obtained organic film is inevitable.

By blending (A) the heat-decomposable polymer according to the above-mentioned embodiment, excellent filling-up and flattening characteristics can be expressed during the period from application of the organic film composition to the thermal cure because of the enhanced fluidity, while a considerable amount of (A) the heat-decomposable polymer is decomposed and volatized by the heat treatment so that deterioration of various properties including a curing property, an etching resistance, an optical property, and a heat resistance in the finally formed organic film can be suppressed. In this specification, the weight reduction rate is a value based on the TG measurement (thermogravimetry) by a differential thermogravimetry. The weight-average molecular weight of the polymer is a value based on the gel permeation chromatography measurement (based on the polystyrene standard by using tetrahydrofuran solvent).

Hereunder, the present invention will be explained more specifically.

(A) Heat-Decomposable Polymer
As to the preferred embodiment of (A) the heat-decomposable polymer, a polymer having a repeating unit that contains an acetal structure shown by the following general formula (1) may be mentioned,

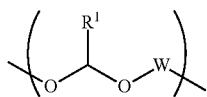

(1)

wherein $R^1$ represents a hydrogen atom, or an optionally substituted, saturated or unsaturated monovalent organic group having 1 to 30 carbon atoms. W represents a saturated or unsaturated divalent organic group having 2 to 30 carbon atoms.

As to the further preferable embodiment of (A) the heat-decomposable polymer, the polymer comprising one or more compounds shown by the following general formulae (1a) to (1c), namely the heat-decomposable polymer (hereinafter, sometimes referred to as heat-decomposable polymers (1a) to (1c)), may be mentioned,

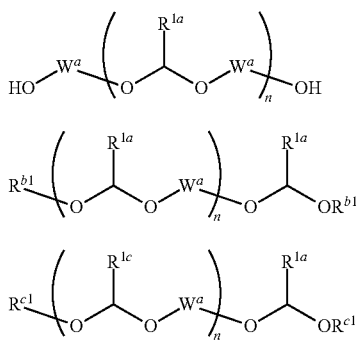

wherein $R^{1a}$ represents an alkyl group having 1 to 4 carbon atoms. $W^a$ represents a saturated or unsaturated divalent hydrocarbon group having 4 to 10 carbon atoms and optionally containing an ether bond. Each of $R^{b1}$ independently represents —$W^a$—OH, or an optionally substituted, saturated or unsaturated monovalent organic group having 1 to 30 carbon atoms. $R^{1c}$ represents a hydrogen atom, an optionally substituted aryl group having 6 to 20 carbon atoms, or a heteroaryl group having 4 to 20 carbon atoms. Each of $R^{c1}$ independently represents an alkyl group having 1 to 4 carbon atoms, or —$W^a$—OH. "n" represents an average number of the repeating unit, and is in the range of 3 to 500.

Presence of the chain acetal structure shown by the general formula (1) or by the general formulae (1a) to (1c) is effective in providing (A) the heat-decomposable polymer with an appropriate heat-decomposition property and fluidity. In addition, this becomes a low molecular weight compound having a high volatility after the thermal decomposition; and thus, deterioration of various properties, including a cure property of the film, an etching resistance, an optical property, and a heat resistance, due to a large amount of residual matters in the film, can be suppressed.

In the general formula (1), $R^1$ represents a hydrogen atom or an optionally substituted, saturated or unsaturated monovalent organic group having 1 to 30 carbon atoms.

In the present invention, the term "organic group" means a group that contains at least one carbon atom, and it may further contain not only hydrogen but also nitrogen, oxygen, sulfur, silicon, halogen atoms, and so forth.

$R^1$ may be a single kind or a mixture of plural kinds. Specific example of $R^1$ includes a hydrogen atom, a methyl group, an ethyl group, a vinyl group, a 2,2,2-trifluoroethyl group, a propyl group, an isopropyl group, an allyl group, a 1-propenyl group, an isopropenyl group, a butyl group, a s-butyl group, a t-butyl group, an isobutyl group, a pentyl group, a cyclopentyl group, a hexyl group, a cyclohexyl group, a cyalohexenyl group, a decyl group, a dodecyl group, an icosyl group, a norbornyl group, an adamantyl group, a phenyl group, a toluoyl group, a xylyl group, a naphthyl group, a phenanthrenyl group, an anthracenyl group, a benzyl group, a fluorenyl group, a naphthylmethyl group, a norbornenyl group, a triacontyl group, a 2-(uranyl group, and a 2-tetrahydrofuranyl group.

In the general formula (1), W represents a saturated or unsaturated divalent organic group having 2 to 30 carbon atoms. W may be a single kind or a mixture of plural kinds. Specific example of W includes an ethylene group, a propylene group, a butylene group, a trimethylene group, a tetramethylene group, a pentamethylene group, a hexamethylene group, a heptamethylene group, an octamethylene group, a decamethylene group, a dodecamethylene group, an icosamethylene group, a triacontamethylene group, a cyclopentanediyl group, a cyclohexanediyl group, a dimethylcyclohexanediyl group, a 2-butene-1,4-diyl group, a 2,4-hexadiene-1,6-diyl group, a 3-oxapentane-1,5-diyl group, a 3,6-dioxaoctane-1,8-diyl group, a 3,6,9-trioxaundecane-1,11-diyl group, a phenylene group, a xylyl group, a naphthalenediyl group, a dimethylnaphthalenediyl group, and an adamantanediyl group.

In the general formulae (1a) and (1b), $R^{1a}$ represents an alkyl group having 1 to 4 carbon atoms. $R^{1a}$ may be a single kind or a mixture of plural kinds. Specific example of $R^{1a}$ includes a methyl group, an ethyl group, a propyl group, an isopropyl group, a butyl group, a s-butyl group, a t-butyl group, and an isobutyl group.

In the general formulae (1a) to (1c), $W^a$ represents a saturated or unsaturated divalent hydrocarbon group having 4 to 10 carbon atoms and optionally containing an ether bond. $W^a$ may be a single kind or a mixture of plural kinds. Specific example of $W^a$ includes a tetramethylene group, a pentamethylene group, a hexamethylene group, a heptamethylene group, an octamethylene group, a decamethylene group, a cyclopentanediyl group, a cyclohexanediyl group, a dimethylcyclohexanediyl group, a 2-butene-1,4-diyl group, a 2,4-hexadine-1,6-diyl group, a 3-oxapentane-1,5-diyl group, a 3,6-dioxaoctane-1,8-diyl group, a 3,6,9-trioxaundecane-1,11-diyl group, a phenylene group, a xylyl group, and an adamantanediyl group.

In the general formula (1b), each of $R^{b1}$ independently represents —$W^a$—OH, or an optionally substituted, saturated or unsaturated monovalent organic group having 1 to 30 carbon atoms. Specific example of the optionally substituted, saturated or unsaturated monovalent organic group having 1 to 30 carbon atoms includes a methyl group, an ethyl group, a vinyl group, a 2,2,2-trifluoroethyl group, a propyl group, an isopropyl group, an allyl group, a 1-propenyl group, an isopropenyl group, a butyl group, a s-butyl group, a t-butyl group, an isobutyl group, a pentyl group, a cyclopentyl group, a hexyl group, a cyclohexyl group, a cyclohexenyl group, a decyl group, a dodecyl group, an icosanyl group, a norbornyl group, an adamantyl group, a phenyl group, a toluoyl group, a xylyl group, a naphthyl group, a phenanthrenyl group, an anthracenyl group, a benzyl group, a fluorenyl group, a naphthylmethyl group, a norbornenyl group, an icosanyl group, a triacontyl group, a 2-furanyl group, and a 2-tetrahydrofuranyl group.

In the general formula (1c), $R^{1c}$ represents a hydrogen atom, an optionally substituted aryl group having 6 to 20 carbon atoms, or a heteroaryl group having 4 to 20 carbon atoms. $R^{1c}$ may be a single kind or a mixture of plural kinds. Specific example of $R^{1c}$ includes a hydrogen atom, a phenyl group, a toluoyl group, a xylyl group, a naphthyl group, a phenanthrenyl group, an anthracenyl group, a 2-furanyl group, and an anisyl group.

In the general formula (1c), each of $R^{c1}$ independently represents an alkyl group having 1 to 4 carbon atoms, or —$W^a$—OH. Specific example of the alkyl group having 1 to 4 carbon atoms includes a methyl group, an ethyl group, a propyl group, an isopropyl group, a butyl group, a s-butyl group, a t-butyl group, and an isobutyl group.

"n" represents an average number of the repeating unit, and is in the range of 3 to 500, or preferably 5 to 300.

In the case that (A) the heat-decomposable polymer has a repeating unit having an acetal structure shown by the general formula (1), it may have a single repeating unit or a mixture of two or more kinds of the repeating unit.

Specific example of the repeating unit having an acetal structure shown by the general formula (1) includes followings, though not limited to them.

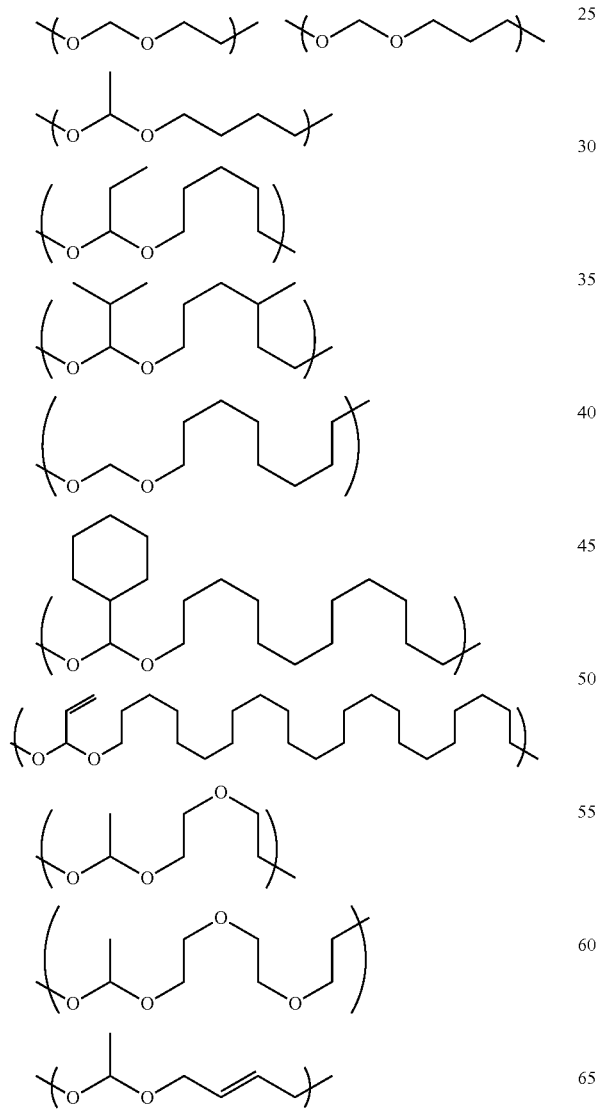

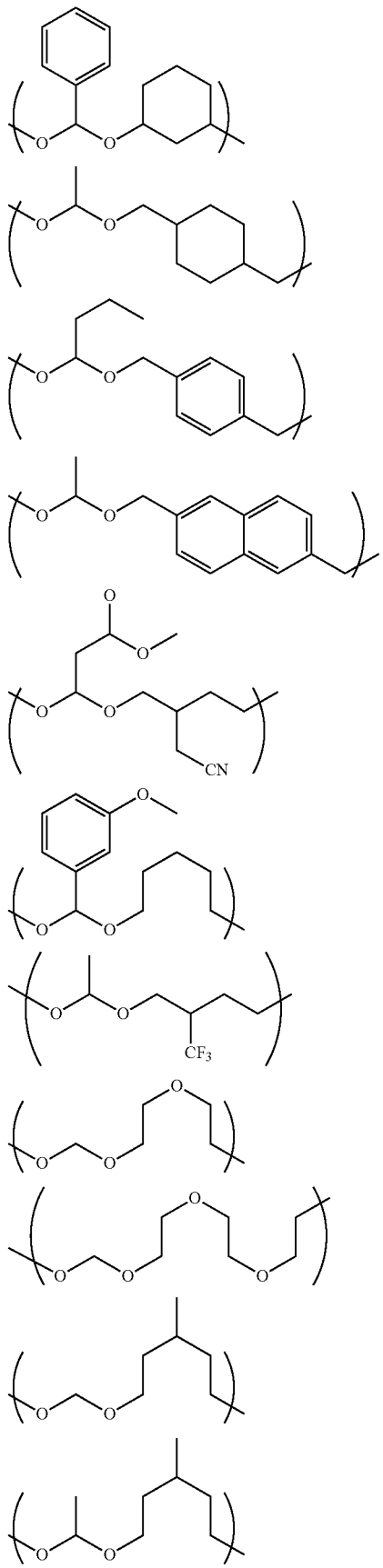

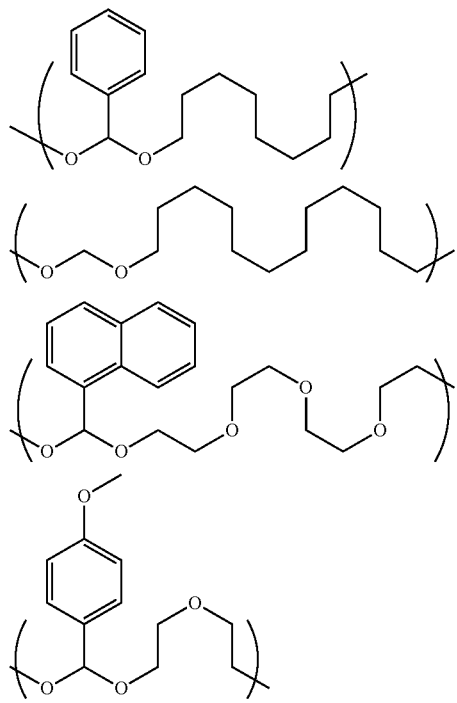
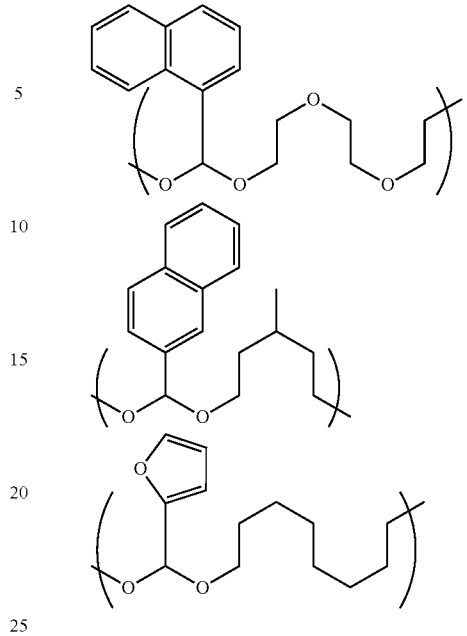
Specific example of the compound shown by the general formula (1a) includes followings, though not limited to them. "n" in the formulae has the same meaning as before.
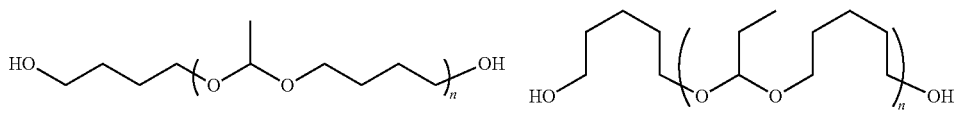
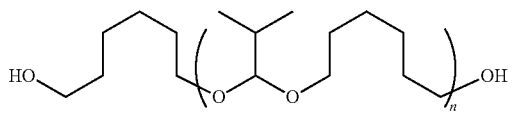
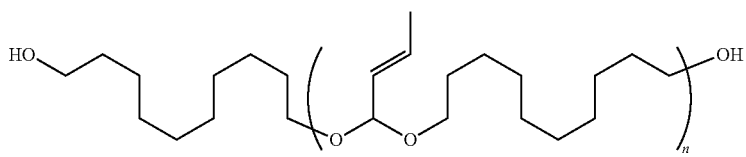
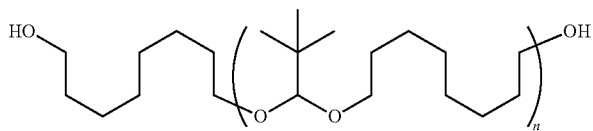
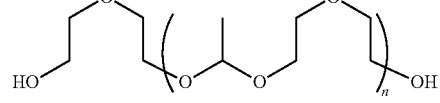
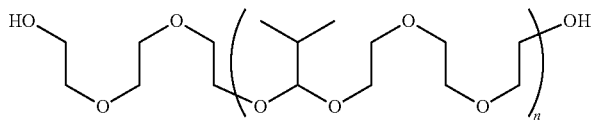
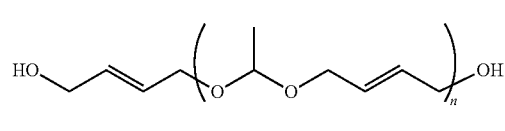
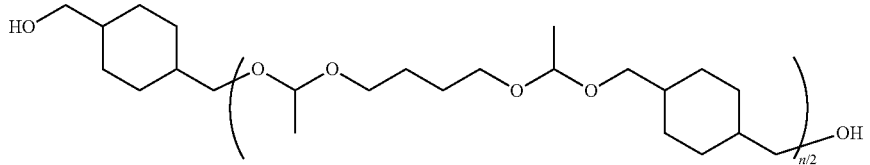

Specific example of the compound shown by the general formula (1b) includes followings, though not limited to them. "n" in the formulae has the same meaning as before.

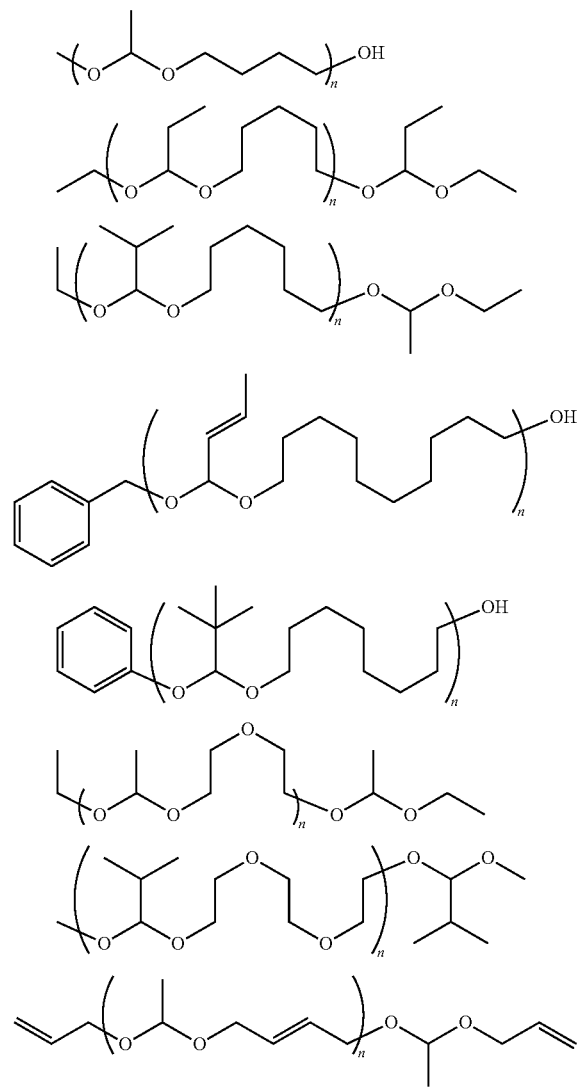

Specific example of the compound shown by the general formula (1c) includes followings, though not limited to them. "n" in the formulae has the same meaning as before.

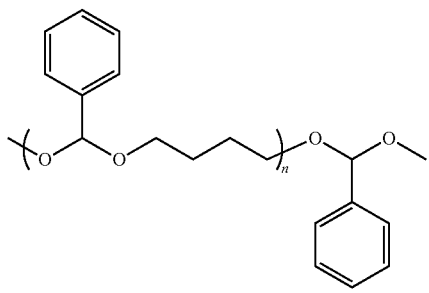

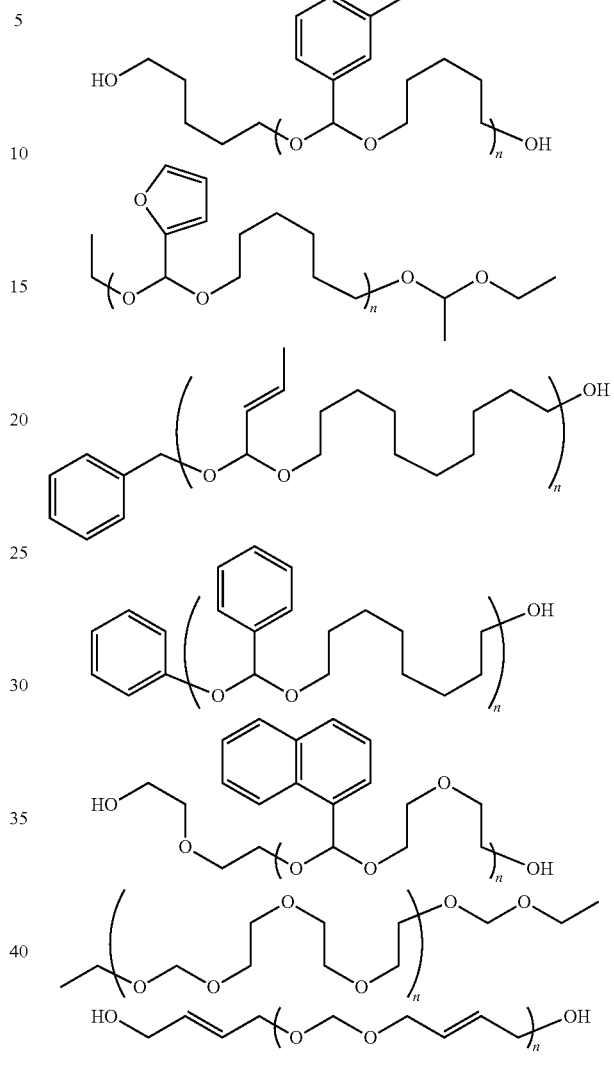

By selecting structures of $R^1$, $R^{1a}$, $R^{b1}$, $R^{1c}$, $R^{c1}$, W, and $W^a$, properties such as the thermal decomposition temperature, the weight reduction rate by heating, and the fluidity of (A) the heat-decomposable polymer can be controlled as appropriately, and then eventually, characteristics of the organic film composition can be controlled.

Especially the heat-decomposable polymers (1a) to (1c) are excellent in fluidity; and at the same time, the weight reduction rate thereof by heating can be readily made to 70% or more by mass by selecting structures of $R^{1a}$ and $W^a$. The heat-decomposable polymers (1a) and (1b) are preferable because the thermal decomposition temperatures thereof are so low that decrease in the etching resistance of the organic film composition can be further suppressed. The heat-decomposable polymer (1c) is preferable because it can function as a crosslinking agent in a certain instance so that the controllable range of characteristics of the organic film composition can be enlarged further.

The weight-average molecular weight of (A) the heat-decomposable polymer is preferably in the range of 300 to 200,000, more preferably 300 to 50,000, or still more preferably 500 to 40,000. The average number of the repeating unit is preferably in the range of 3 to 2,000, or more preferably 3 to 500. If the weight-average molecular weight is 300 or more, decrease of the blending effect due to volatilization and the like can be suppressed so that the satisfactory blending effect can be obtained. If the weight-average molecular weight is 200,000 or less, the excellent filling-up and flattening characteristics can be obtained without deteriorating the fluidity and so on.

Blending amount of (A) the heat-decomposable polymer is preferably in the range of 5 to 500 parts by mass, or more preferably 10 to 200 parts by mass, relative to 100 parts by mass of (C) the aromatic ring containing resin. If the blending amount of (A) the heat-decomposable polymer is 5 or more parts by mass, the satisfactory blending effect can be obtained. If the blending amount is 500 or less parts by mass, a further excellent etching resistance can be obtained.

The heat-decomposable polymer having the structure shown by the general formula (1) or (1a) can be produced by selecting an optimum method in accordance with the structure thereof. For example, the heat-decomposable polymer (1a) can be produced specifically by a method selected from the following three methods. In a similar manner, the heat-decomposable polymer (1) can be produced. Meanwhile, the method for the heat-decomposable polymer is not limited to these methods.

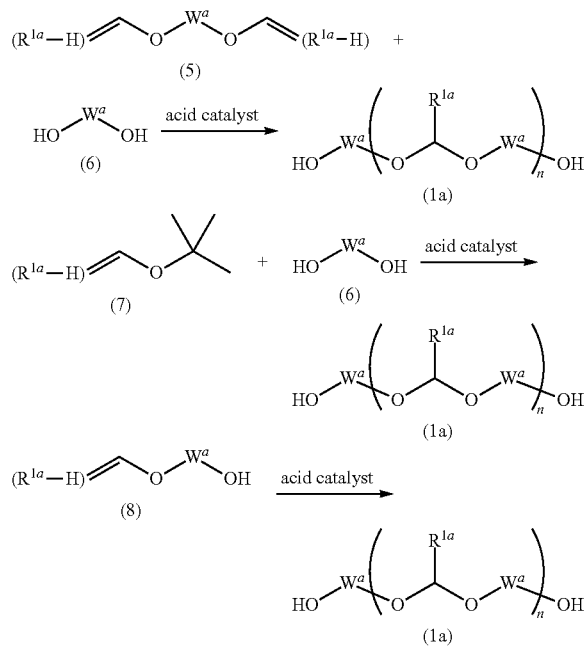

Wherein $R^{1a}$ represents an alkyl group having 1 to 4 carbon atoms. $W^a$ represents a saturated or unsaturated divalent hydrocarbon group having 4 to 10 carbon atoms and optionally containing an ether bond. "n" represents an average number of the repeating unit, and is in the range of 3 to 500.

In the reactions shown above, the elementary reaction is a general acetal-formation reaction by an acid catalyst. This elementary reaction takes place repeatedly to form a final polymer. In the reaction shown above, the optimum amount of the diol compound (6) relative to the diether compound (5) is preferably in the range of 0.5 to 2 moles, or in particular 0.8 to 1.2 moles. In the reaction shown above, the optimum amount of the diol compound (6) relative to 1 mole of the t-butyl ether compound (7) is preferably in the range of 0.5 to 2 moles, or in particular 0.8 to 1.2 moles.

The acetal-formation reaction may be carried out by mixing respective raw materials with an acid catalyst in a solvent or without a solvent followed by cooling or heating. If a solvent is used in the reaction, the reaction may be carried out by selecting one solvent or a mixture of two or more solvents from aliphatic hydrocarbons such as hexane and heptane; aromatic hydrocarbons such as toluene, xylene, trimethylbenzene, and methylnaphthalene; ethers such as diethyl ether, dibutyl ether, diethylene glycol diethyl ether, diethylene glycol dimethyl ether, and tetrahydrofuran; ketones such as acetone and 2-butanone; alcohols such as t-butyl alcohol and amyl alcohol; esters such as ethyl acetate, propylene glycol monomethyl ether acetate, and γ-butyrolactone; nitriles such as acetonitrile; amides such as N,N-dimethyl formamide and N,N-dimethyl acetamide; halogenated hydrocarbons such as o-dichlorobenzene, methylene chloride, and 1,2-dichloroethane; and so forth.

Acid catalysts of various inorganic acids and organic acids can be used for the reactions, while specific example thereof includes hydrochloric acid, nitric acid, sulfuric acid, formic acid, oxalic acid, acetic acid, methanesulfonic acid, camphorsulfonic acid, tosyl acid, trifluoromethanesulfonic acid, a cationic ion-exchange resin, sodium hydrogen sulfate, and pyridinium p-toluenesulfonate. Adding amount of these acid catalysts is preferably in the range of $1\times10^{-5}$ to $5\times10^{-1}$ mole relative to 1 mole of total raw materials.

Reaction temperature is preferably in the range of −20 to 100° C., or more preferably 0 to 80° C. When a solvent is used, the upper temperature limit thereof is preferably around the boiling temperature of the solvent. If the reaction temperature is −20° C. or higher, the reaction takes place smoothly, while at 100° C. or lower, a side-reaction such as decomposition of the product can be suppressed. In order to enhance the reaction yield, it is desirable to determine the reaction time of the foregoing reactions by following the reaction by a thin-layer chromatography, a liquid chromatography, a gel permeation chromatography, or the like, while the time is usually in the range of about 0.5 to 200 hours. After the reaction, the intended heat-decomposable polymer (1a) may be obtained by any one of usual aqueous work-up and separation of insoluble matters by filtration or both.

The heat-decomposable polymer (1a) thus obtained may be purified, if necessary, by a usually used method such as liquid-liquid separation, crystallization, concentration under reduced pressure, dialysis, and ultrafiltration in accordance with the properties thereof. In addition, the metal content therein may be reduced by passing it through a commercially available demetallation filter, if necessary.

As to how to carry out the reaction, for example, following methods may be used: all raw materials, an acid catalyst, and as appropriate, a solvent are charged all at once; each of raw materials or raw material solutions is gradually added separately or as a mixture of them in the presence of an acid catalyst; and a mixture of raw materials or a solution of mixed raw materials is passed through a column or the like packed with a solid acid catalyst. Control of the molecular weight may be done, for example, by controlling the reaction time, by controlling amount of the catalyst, by controlling addition of a polymerization terminator such as water, an alcohol, and a basic compound or by control of amount of these terminators, by controlling the ratio of raw materials if two or more raw materials are used, or by controlling combination of a plurality of these measures.

The raw material compounds shown by the general formulae (5) to (8) each may be used singly or in a combination of two or more of them. A compound including the raw material compounds shown by the general formulae (5), (7), and (8) is sometimes unstable to an oxygen, a light, water, and the like; and if it is the case, the reaction is preferably carried out under an inert atmosphere such as nitrogen and without a light.

Specifically, the heat-decomposable polymers (1b) and (1c) may be produced, for example, by selecting a method from the following two methods. In a similar manner, the heat-decomposable polymer (1) may be produced. Meanwhile, the method for producing the heat-decomposable polymer is not limited by them.

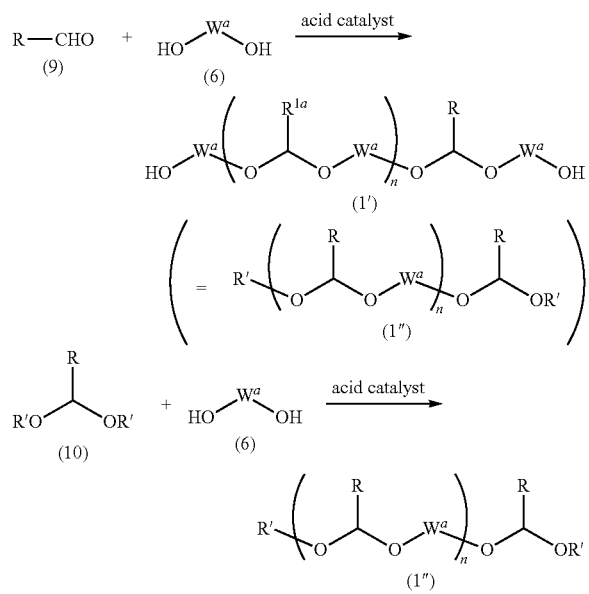

wherein R represents $R^{1a}$ or $R^{1c}$. R' represents $R^{b1}$ or $R^{c1}$. $W^a$ represents a saturated or unsaturated divalent hydrocarbon group having 4 to 10 carbon atoms and optionally containing an ether bond. Each of $R^{b1}$ independently represents —$W^a$—OH, or an optionally substituted, saturated or unsaturated monovalent organic group having 1 to 30 carbon atoms. $R^{1c}$ represents a hydrogen atom, an optionally substituted aryl group having 6 to 20 carbon atoms, or a heteroaryl group having 4 to 20 carbon atoms. Each of $R^{c1}$ independently represents an alkyl group having 1 to 4 carbon atoms, or —$W^a$—OH. "n" represents an average number of the repeating unit, and is in the range of 3 to 500.

In the reactions shown above, the elementary reaction is a general acetal-formation reaction by an acid catalyst. This elementary reaction takes place repeatedly to form a final polymer. In the reaction shown above, the optimum amount of the diol compound (6) relative to 1 mole of the aldehyde compound (9) is preferably in the range of 0.5 to 2 moles, or in particular 0.8 to 1.2 moles. In the reaction shown above, the optimum amount of the diol compound (6) relative to 1 mole of the acetal compound (10) is preferably in the range of 0.5 to 2 moles, or in particular 0.8 to 1.2 moles.

The acetal-formation reaction may be carried out by mixing respective raw materials with an acid catalyst in a solvent or without a solvent followed by cooling or heating. If a solvent is used in the reaction, the reaction may be carried out by selecting one kind or a mixture of two or more kinds of solvents from aliphatic hydrocarbons such as hexane and heptane; aromatic hydrocarbons such as toluene, xylene, trimethylbenzene, and methylnaphthalene; ethers such as diethyl ether, dibutyl ether, diethylene glycol diethyl ether, diethylene glycol dimethyl ether, and tetrahydrofuran; ketones such as acetone and 2-butanone; alcohols such as t-butyl alcohol and amyl alcohol; esters such as ethyl acetate, propylene glycol monomethyl ether acetate, and γ-butyrolactone; nitriles such as acetonitrile; amides such as N,N-dimethyl formamide and N,N-dimethyl acetamide; halogenated hydrocarbons such as o-dichlorobenzene, methylene chloride, and 1,2-dichloroethane; and the like.

Acid catalysts of various inorganic acids and organic acids can be used for the reactions, wherein specific example thereof includes hydrochloric acid, nitric acid, sulfuric acid, formic acid, oxalic acid, acetic acid, methanesulfonic acid, camphorsulfonic acid, tosyl acid, trifluoromethanesulfonic acid, an cationic ion-exchange resin, sodium hydrogen sulfate, and pyridinium p-toluenesulfonate. Adding amount of these acid catalysts is preferably in the range of $1 \times 10^{-5}$ to $5 \times 10^{-1}$ mole relative to 1 mole of total raw materials.

Reaction temperature is preferably in the range of 0 to 250° C., or more preferably 20 to 200° C. When a solvent is used, the upper temperature limit thereof is preferably around the boiling temperature of the solvent. If the reaction temperature is 0° C. or higher, the reaction takes place smoothly, while at 250° C. or lower, a side-reaction such as decomposition of the product can be suppressed. In order to enhance the reaction yield, it is desirable to determine the reaction time of the foregoing reactions by following the reaction by a thin-layer chromatography, a liquid chromatography, a gel permeation chromatography, and the like, while the time is usually in the range of about 0.5 to 200 hours. After the reaction, the intended heat-decomposable polymer (1″), namely (1b) or (1c), can be obtained by any one of usual aqueous work-up and separation of insoluble matters by filtration or both.

The heat-decomposable polymer (1″) thus obtained may be purified, if necessary, by a usually used method such as liquid-liquid separation, crystallization, concentration under reduced pressure, dialysis, and ultrafiltration in accordance with the properties thereof. In addition, the metal content therein may be reduced by passing it through a commercially available demetallation filter, if necessary.

As to how to carry out the reaction, for example, following methods may be used: all raw materials, an acid catalyst, and as appropriate, a solvent are charged all at once; each of raw materials or raw material solution is gradually added separately or as a mixture of them in the presence of an acid catalyst; and a mixture of raw materials or a solution of mixed raw materials is passed through a column or the like packed with a solid acid catalyst. It is preferable to carry out the reaction while removing water or an alcohol formed by the reaction because the reaction rate can be increased by so doing. Control of the molecular weight may be done, for example, by controlling the reaction time, by controlling amount of the catalyst, by controlling addition of a polymerization terminator such as water, an alcohol, and a basic compound or by control of amount of these terminators, by controlling the ratio of raw materials, or by controlling combination of a plurality of these measures.

(B) Organic Solvent

There is no particular restriction in (B) the organic solvent usable in the organic film composition so far as it can dissolve a heat-decomposable polymer in the component (A) and an aromatic ring containing resin of the component (C); but it is preferable that the organic solvent can dissolve a phenolic hydroxyl group containing compound, an acid generator, a crosslinking agent, a surfactant, and so forth, while these will be explained later. Specific example thereof includes ketones such as 2-heptanone, cyclopentanone, and cyclohexanone;

alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, γ-butyrolactone, and propylene glycol mono-tert-butyl ether acetate, wherein these may be used singly or as a mixture of two or more of them, though not limited to them.

Of the above-mentioned solvents, propylene glycol monomethyl ether acetate, propylene glycol monomethyl ether, 2-heptanone, cyclopentanone, cyclohexanone, γ-butyrolactone, and a mixture of two or more of them may be used preferably.

Blending amount of the organic solvent of the component (B) is preferably in the range or 200 to 10,000 parts by mass, in particular 300 to 5,000 by mass, relative to 100 parts by mass of (C) the aromatic ring containing resin.

(C) Aromatic Ring Containing Resin

There is no particular restriction in (C) the aromatic ring containing resin usable in the organic film composition so far as the resin satisfies the spin coating property and the curing property; but a resin that has a naphthalene ring is more preferable in view of the etching resistance, the optical property, the heating resistance, and so forth.

Specifically, it is preferable that (C) the aromatic ring containing resin blended into the resist underlayer film composition comprises a resin (C1) that is obtained by polycondensation of any one or more compounds shown by the following general formulae (2a) and (2b) with a compound shown by the following general formula (3),

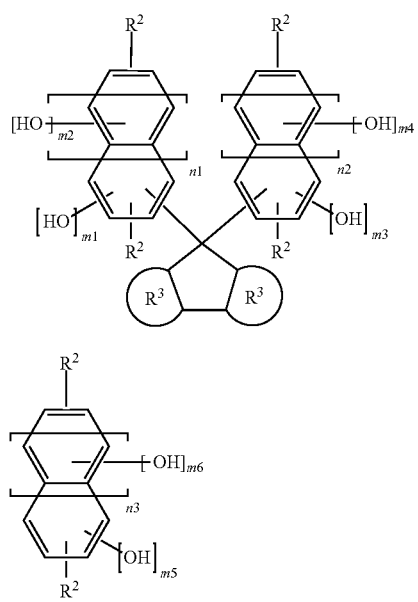

(2a)

(2b)

wherein each of $R^2$ independently represents a hydrogen atom, or a saturated or unsaturated hydrocarbon group having 1 to 20 carbon atoms. Each of $R^3$ independently represents a benzene ring or a naphthalene ring. Each of m1+m2, m3+m4, and m5+m6 represents 1 or 2. Each of n1, n2, and n3 represents 0 or 1,

A-CHO (3)

wherein A represents any of a hydrogen atom, a hydrocarbon group having 1 to 10 carbon atoms, and an optionally substituted aromatic hydrocarbon group having 6 to 20 carbon atoms.

Specific example of the compound shown by the general formula (2a) includes the followings.

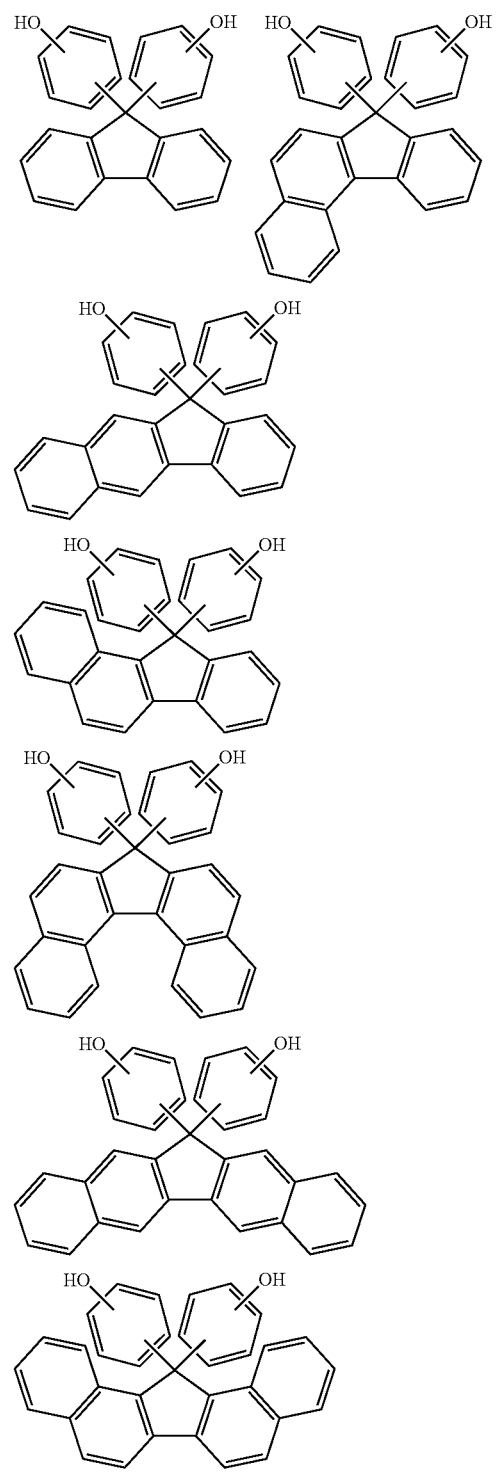

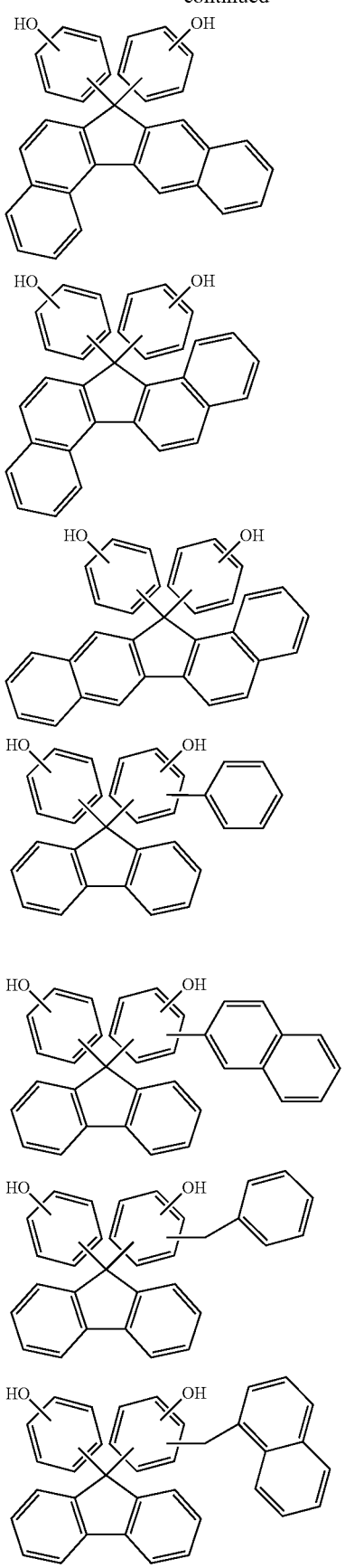
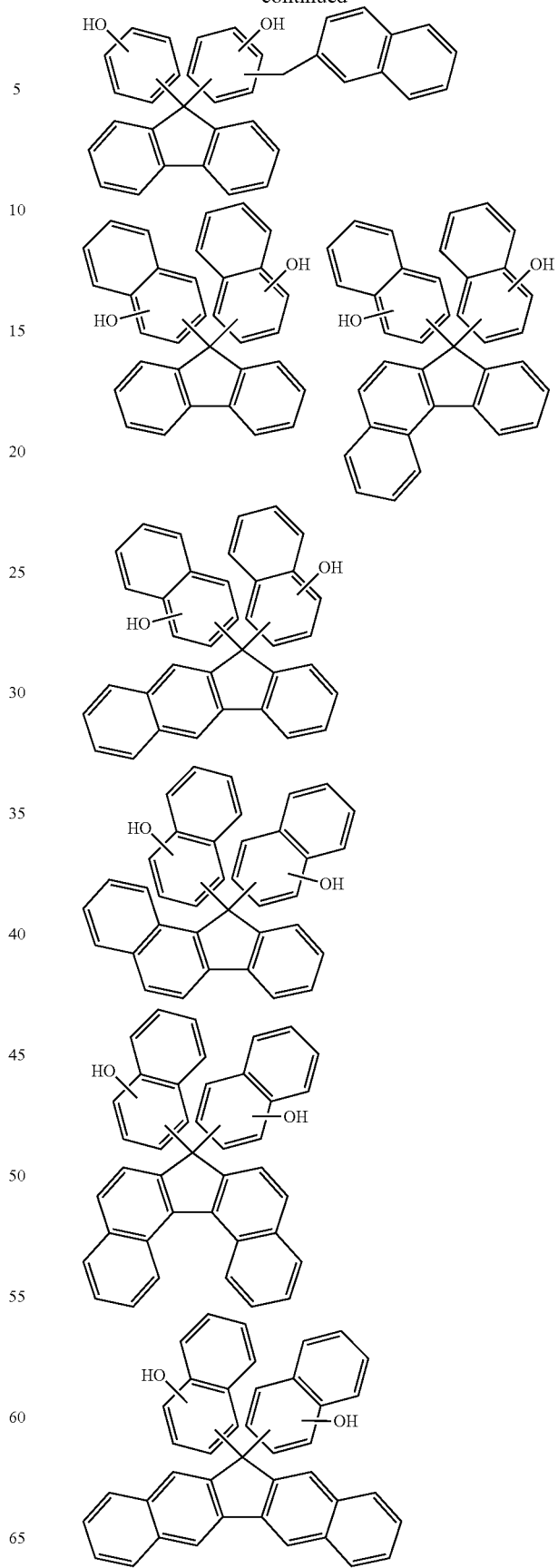

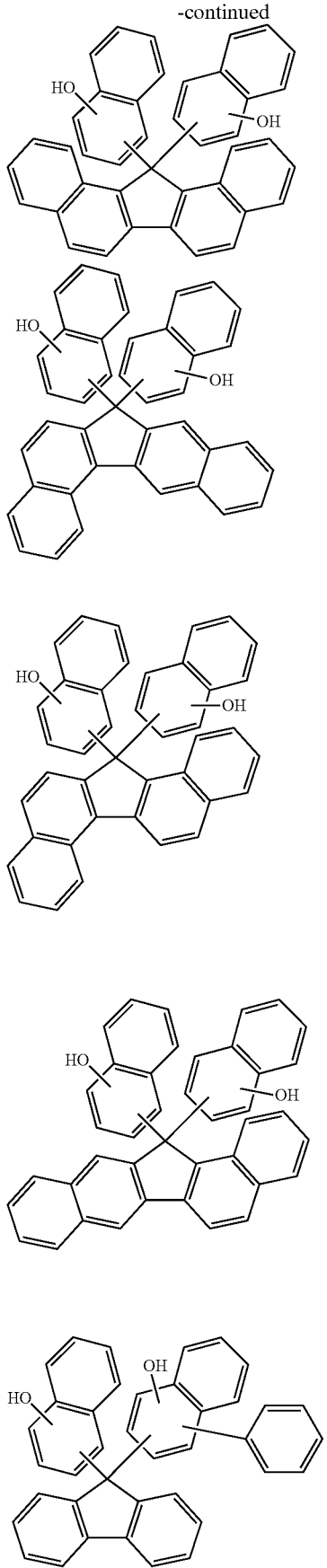
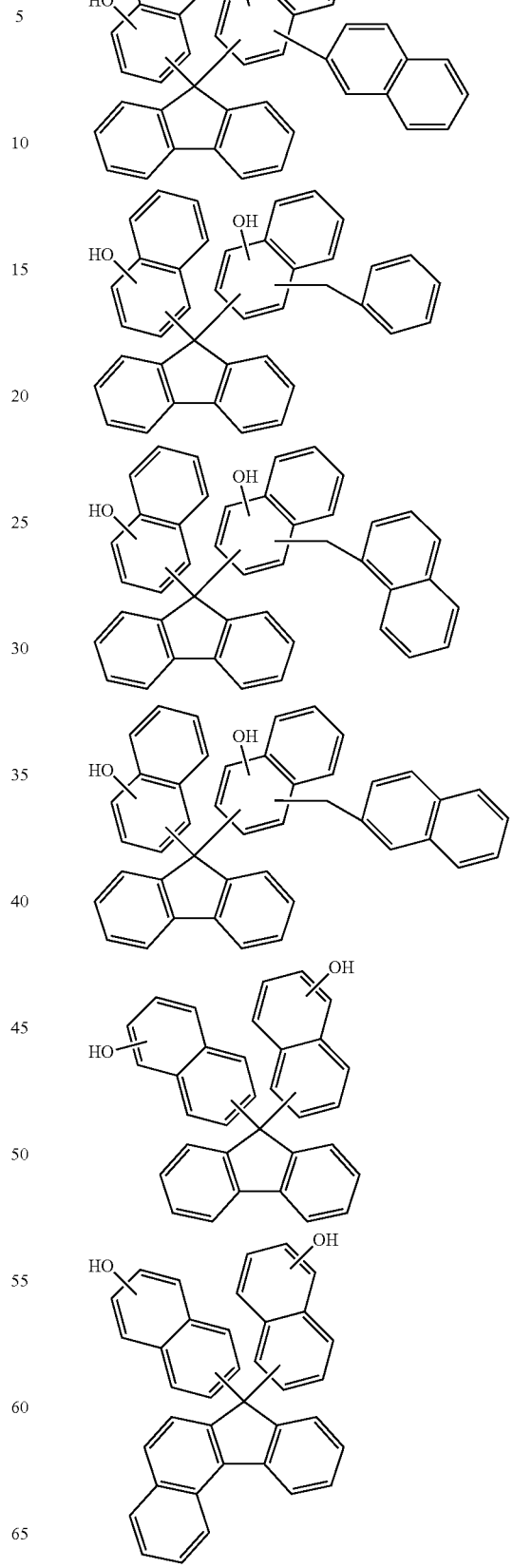

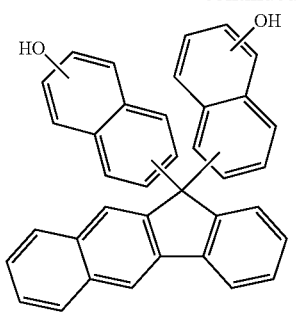
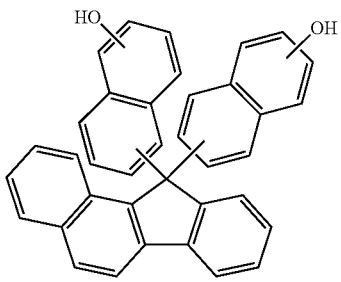
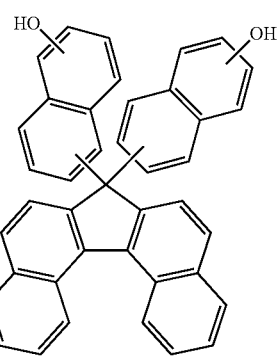
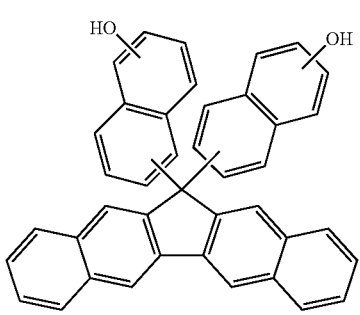
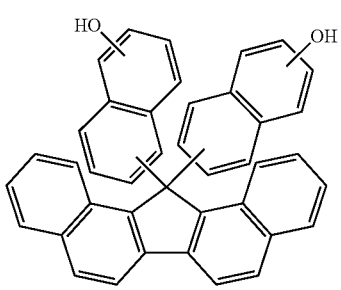
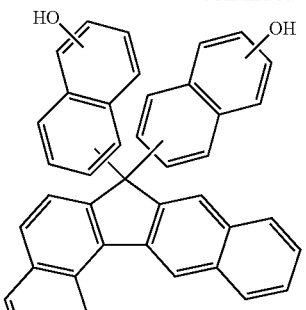
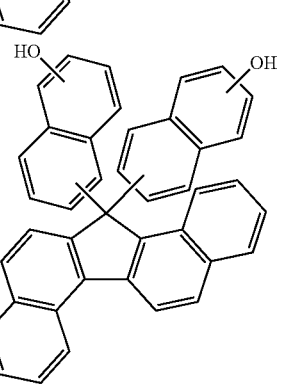
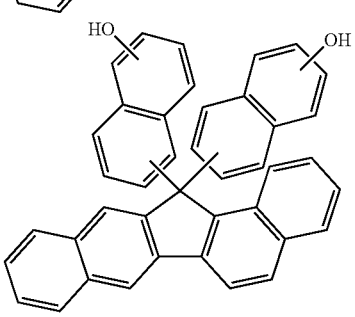
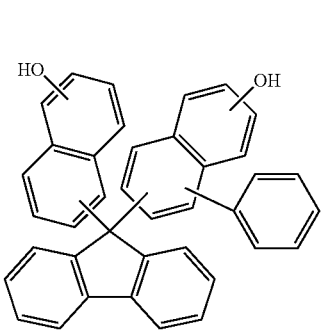
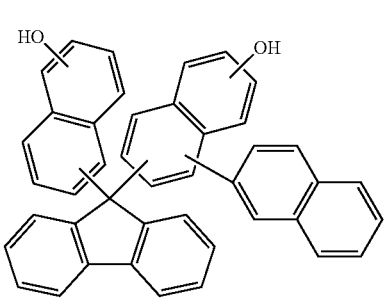

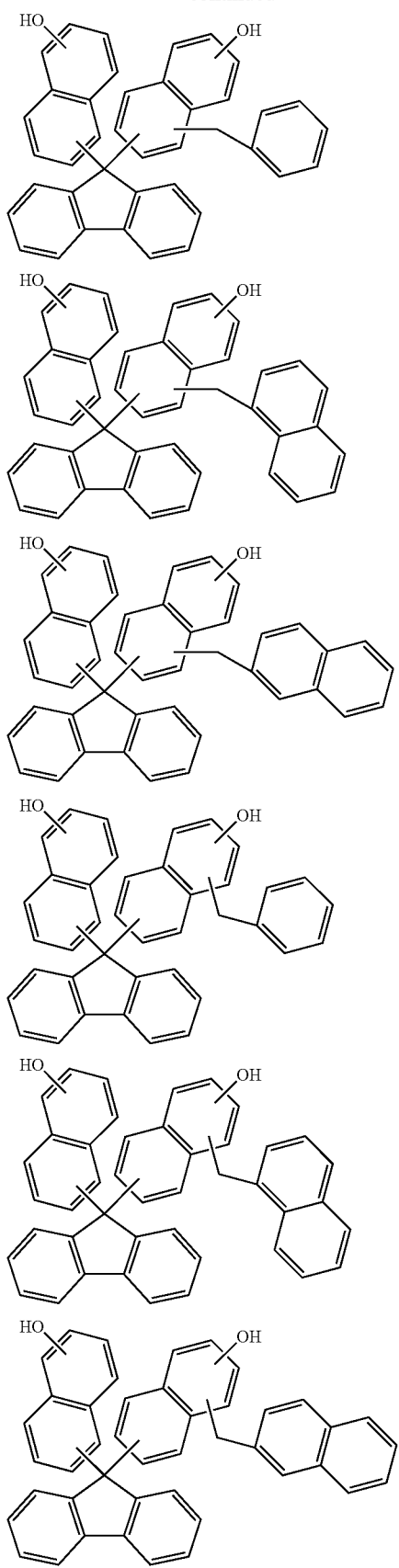
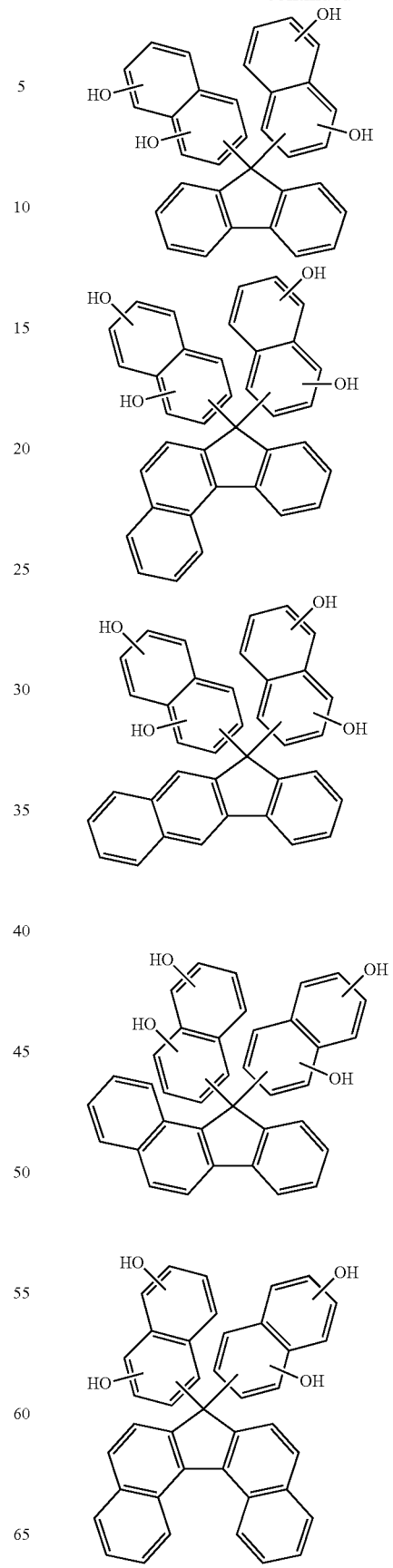

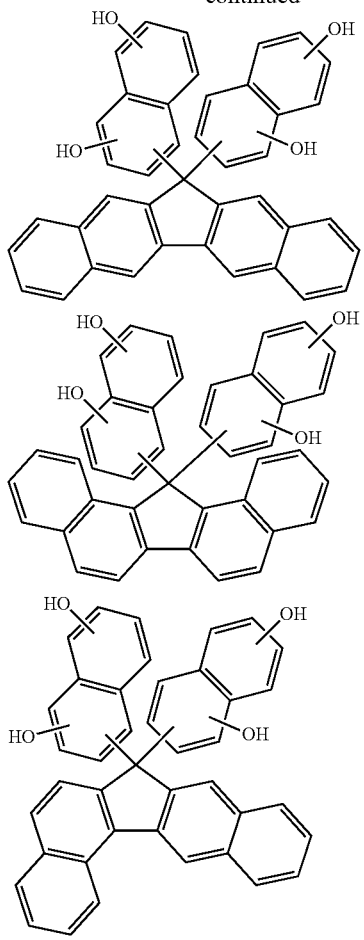
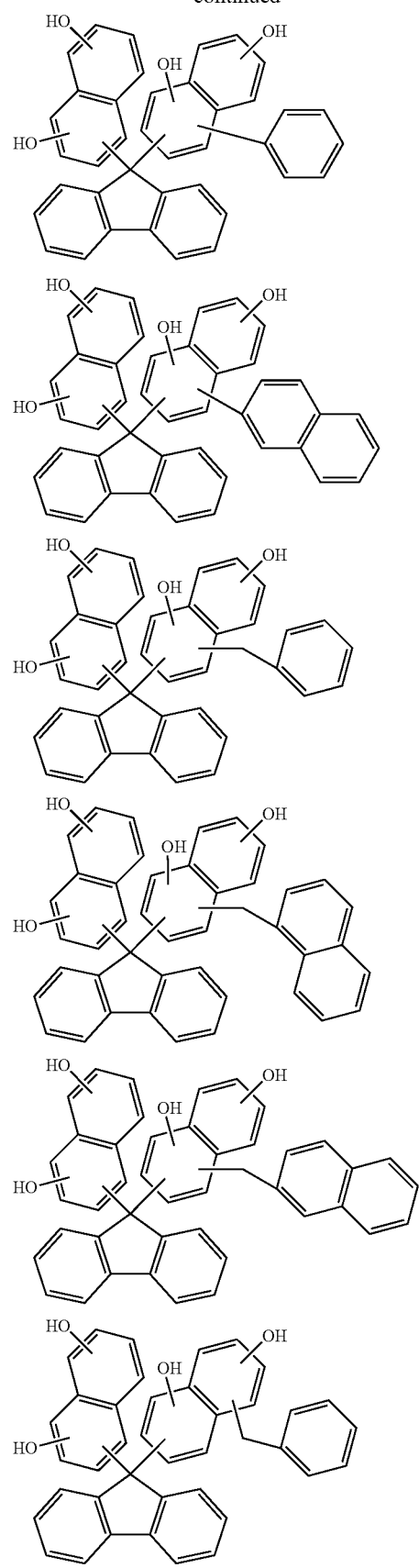

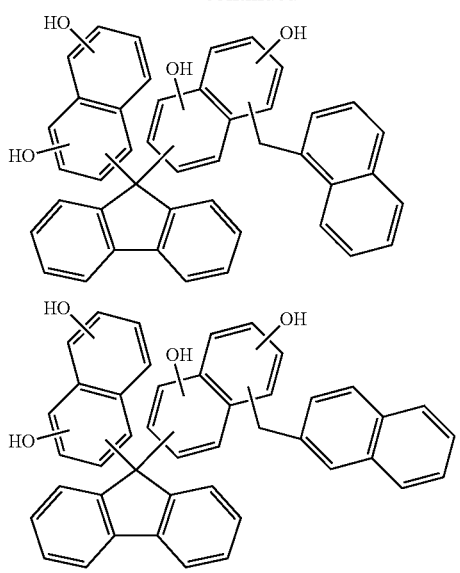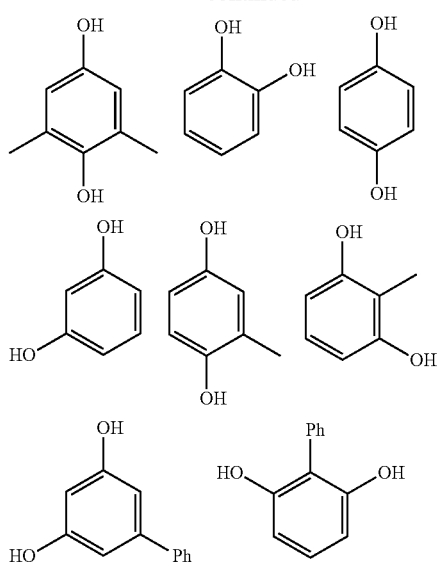

The compounds shown above have the cardo structure of the tertiary carbon atom, by which they have a very high heat resistance. When an inorganic hard mask middle layer film of a silicon oxide film, a silicon nitride film, a silicon oxynitride film, or the like is formed on a resist underlayer film or on a flat film for manufacturing of a semiconductor device by a CVD method or the like, a high temperature is necessary; especially in the case of the nitride film, temperature of 300° C. or higher is required. Nonetheless, these compounds can be used excellently for those uses.

Specific example of the compound shown by the general formula (2b) includes the followings. In the following formulae, Ph means a phenyl group, the same being applied hereinafter.

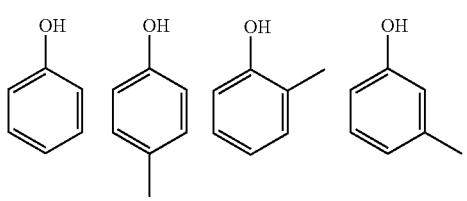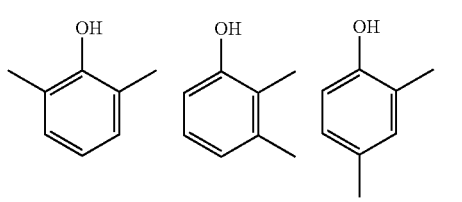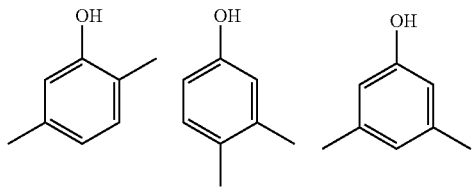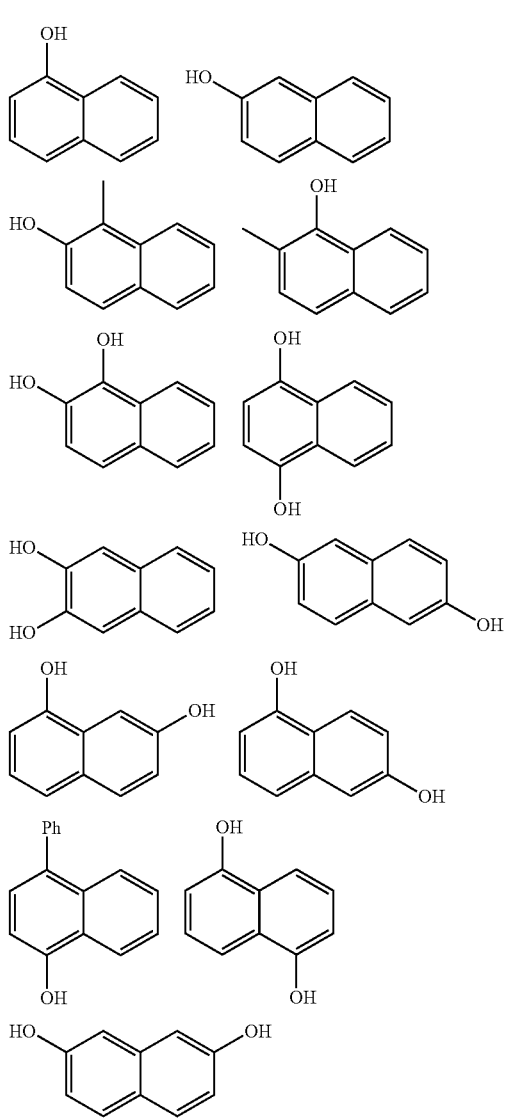

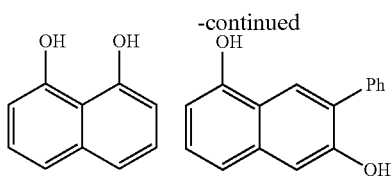

Resins obtained by polycondensation by using the raw materials shown above have an excellent thermal curing property thereby giving a dense and hard film after film formation so that deformation thereof during etching and heat treatment can be suppressed; and thus, they can be used excellently as an underlayer film or a flattened film for various microfabrication processes.

Illustrative example of the compound (aldehydes) shown by the general formula (3) includes formaldehyde, acrolein, benzaldehyde, acetaldehyde, propionaldehyde, phenyl acetaldehyde, α-phenyl propionaldehyde, β-phenyl propionaldehyde, o-hydroxybenzaldehyde, m-hydroxybenzaldehyde, p-hydroxybenzaldehyde, o-chlorobenzaldehyde, m-chlorobenzaldehyde, p chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthaldehyde, 2-naphthaldehyde, 6-hydroxy-2-naphthaldehyde, 1-hydroxy-2-naphthaldehyde, and furfural. Preferable example thereof includes formaldehyde, benzaldehyde, 1-naphthaldehyde, and 2-naphthaldehyde.

Of these aldehydes, especially formaldehyde can be used excellently. In addition, these aldehydes may be used singly or in a combination of two or more of them. Use amount of the aldehyde is preferably in the range of 0.2 to 5 moles, or more preferably 0.5 to 2 moles, relative to 1 mole of the compound shown by any one of the formulae (2a) and (2b) or both.

If formaldehyde is used, the form thereof is not particularly restricted so that any compounds may be used so far as it shows the same reactivity as formaldehyde during the polycondensation reaction; and thus, illustrative example thereof includes paraformaldehyde, hexamethylene tetramine, 1,3,5-trioxane, and an acetal such as formaldehyde dimethyl acetal, in addition to a generally used aqueous solution of formaldehyde.

The resin (C1) may be obtained by polycondensation of any one or more compounds shown by the general formulae (2a) and (2b) with a compound shown by the general formula (3) by using an acid catalyst or a base catalyst.

Specific example of the acid catalyst includes organic acids and mineral acids such as hydrochloric acid, nitric acid, sulfuric acid, formic acid, oxalic acid, acetic acid, methanesulfonic acid, camphorsulfonic acid, tosyl acid, trifluoromethanesulfonic acid, and phosphoric acid. Use amount of these acid catalysts is preferably in the range of $1\times10^{-5}$ to $5\times10^{-1}$ mole relative to 1 mole of the compound shown by any one of the general formula (2a) and the general formula (2b) or both.

Specific example of the base catalyst includes organic bases and inorganic bases such as potassium hydroxide, sodium hydroxide, lithium hydroxide, barium hydroxide, calcium hydroxide, potassium carbonate, sodium carbonate, tetramethyl ammonium hydroxide, an aqueous ammonium, and diazabicycloundecene (DBU). Use amount of these base catalysts is preferably in the range of $1\times10^{-3}$ to $1\times10$ moles relative to 1 mole of the compound shown by any one of the general formula (2a) and the general formula (2b) or both.

As to the solvent for the polycondensation reaction, illustrative example thereof includes water, methanol, ethanol, propanol, butanol, isopropyl alcohol, tetrahydrofuran, dioxane, toluene, xylene, methylene chloride, dichloroethane, methyl cellosolve, methoxypropyl acetate, γ-butyrolactone, butyl cellosolve, and propylene glycol monomethyl ether, or a mixture of them. Amount of these solvents is preferably in the range of 0 to 5,000 parts by mass relative to 100 parts by mass of the reaction raw materials.

Reaction temperature may be selected appropriately in accordance with reactivities of the raw materials, while it is usually in the range of 0 to 200° C.

As to how to carry out the polycondensation, following methods may be used: any one or more compounds shown by the general formulae (2a) and (2b), a compound shown by the general formula (3), and a reaction catalyst are charged all at once; or any one or more compounds shown by the general formulae (2a) and (2b) and a compound shown by the general formula (3) are added gradually in the presence of a reaction catalyst.

After the polycondensation reaction, volatile components may be removed by raising the temperature of the reactor to 130 to 230° C. with the pressure of about 1 to 50 mmHg as appropriate in order to remove an unreacted raw material, a catalyst, or the like that are present in the system. A catalyst and a metal impurity may be removed by a usual work-up of an aqueous system. Alternatively, after a poor solvent is added, fractions of a raw material, a low-molecular weight polymer, and so on may be removed by separating a layer of the poor solvent. Further, if necessary, content of a metal impurity therein may be reduced by passing through a metal-removing filter. These purification operations may be executed singly or as a combination of two or more of them.

Compounds shown by the general formulae (2a) and (2b) may be polymerized singly; or they may be used as a mixture of two or more kinds by combining thereof with a compound other than those shown by the general formulae (2a) and (2b).

The polystyrene-equivalent molecular weight of the resin (C1) obtained by the polycondensation is preferably in the range of 1,000 to 30,000, in particular 1,500 to 20,000, as the weight-average molecular weight (Mw). The resin having the molecular weight distribution in the range of 1.2 to 7 is preferably used.

If the organic film composition contains (C) the aromatic ring containing resin including the resin (C1), the resin underlayer film or the flattening film for manufacturing of a semiconductor device formed therefrom has not only the excellent filling-up and flattening characteristics of a substrate but also the solvent resistance and the heat resistance.

Alternative preferable example of (C) the aromatic ring containing resin comprises a resin (C2) that has one or more repeating units shown by the following general formula (4),

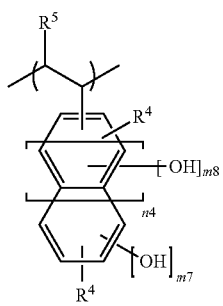

(4)

wherein each of R⁴ independently represents a hydrogen atom, or a saturated or unsaturated hydrocarbon group having 1 to 20 carbon atoms. R⁵ represents a hydrogen atom or may be bonded with one R⁴ to form a ring. When R⁴ and R⁵ are bonded to form a ring, —R⁴—R⁵— represents a single bond or an alkylene group having 1 to 3 carbon atoms. Here, m7+m8 represents 0, 1, or 2, and n4 represents 0 or 1.

Specific example of the repeating unit shown by the general formula (4) includes the followings.

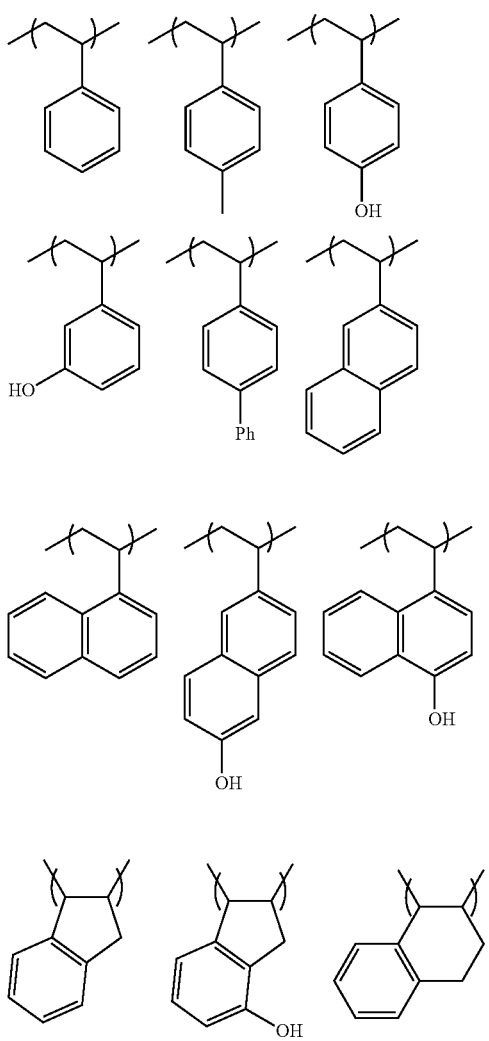

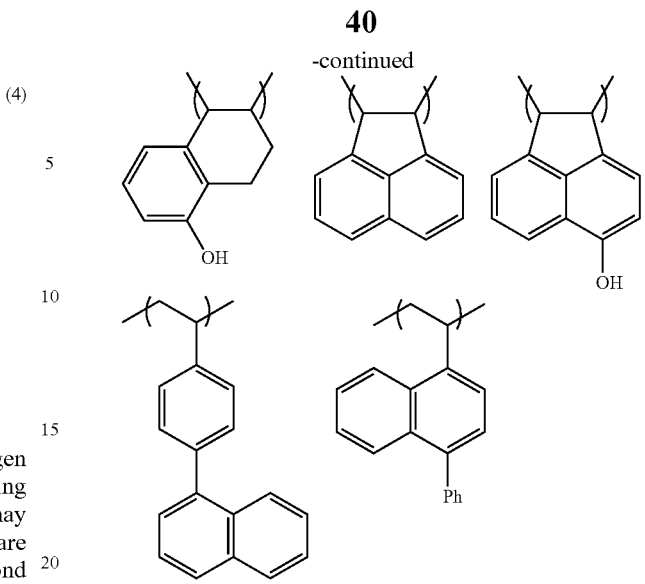

The resin (C2) having the repeating units as shown above has an excellent etching resistance because the carbon density thereof can be made high; and thus, it can be used excellently for microprocessing by etching.

The resin (C2) can be obtained by addition polymerization of one or two or more polymerizable monomers or protected bodies thereof corresponding to the repeating unit shown by the general formula (4) followed by deprotection thereof as necessary. The polymerization reaction can be effected by a usual method such as a radical polymerization method, an anionic polymerization method, and a cationic polymerization method.

For example, the radical polymerization can be done generally by mixing a monomer and a radical polymerization initiator in a solvent or without a solvent followed by heating this mixture.

As to the usable radical polymerization initiator, illustrative example thereof includes azo compounds such as azobisisobutyronitrile and dimethyl azobisisobutanoate, and a peroxide such as benzoyl peroxide.

As to the method for mixing, an appropriate method can be selected in accordance with design of the polymer. For example, any method such as a method wherein relevant substances are mixed all at once, a method wherein a mixture of a monomer and a radical polymerization initiator is added gradually into a heated solvent, and a method wherein a monomer and a radical polymerization initiator are added separately into a solvent may be used.

Amount of the radical polymerization initiator to be used is preferably in the range of $1 \times 10^{-5}$ to $5 \times 10^{-1}$ mole relative to 1 mole of the monomer. In addition, to control the molecular weight of the polymer, to increase a reaction yield, and so forth, a chain-transfer agent such as octanethiol, 3-mercaptopropionic acid, and 2-mercaptoethanol may coexist during polymerization.

If a solvent is used in the radical polymerization, illustrative example of the reaction solvent includes water, methanol, ethanol, propanol, butanol, isopropyl alcohol, tetrahydrofuran, dioxane, toluene, xylene, methylene chloride, dichloroethane, methyl cellosolve, methoxypropyl acetate, γ-butyrolactone, butyl cellosolve, propylene glycol monomethyl ether, 2-butanone, methyl isobutyl ketone, cyclohexanone, propylene glycol monomethyl ether acetate, or a mixture of them. Amount of these solvents is preferably in the range of 0 to 5,000 parts by mass relative to 100 parts by mass of the reaction raw materials. Reaction temperature may be selected appropriately in accordance with the reactivity of a raw material and the decomposition temperature of an initiator, while it is usually in the range of 0 to 100° C.

After the polymerization reaction, an impure substance such as a metal may be removed by a usual work-up of an aqueous system. Alternatively, after a poor solvent is added, fractions of a raw material, a low-molecular weight polymer, and so on may be removed by separating a layer of the poor solvent. Further, if necessary, content of a metal impurity therein may be reduced by passing through a metal-removing filter. These purification operations may be executed singly or as a combination of two or more of them.

A polymerizable olefin compound or a protected body thereof corresponding to the repeating unit shown by the general formula (4) may be polymerized singly, or as a mixture of two or more of them, or by further combining thereof with other heretofore known polymerizable olefin monomers.

The polystyrene-equivalent molecular weight of the resin (C2) is preferably in the range of 1,000 to 100,000, in particular 1,500 to 50,000, as the weight-average molecular weight (Mw). The resin having the molecular weight distribution in the range of 1.2 to 7 is preferably used.

In addition to the resins (C1) and (C2), for example, a resin obtained by polycondensation of one or two or more aromatic ring containing compounds shown by the following formulae with a compound shown by the general formula (3) under an acidic or a basic condition may be mentioned. In the following formulae, Me means a methyl group, the same being applied hereinafter.

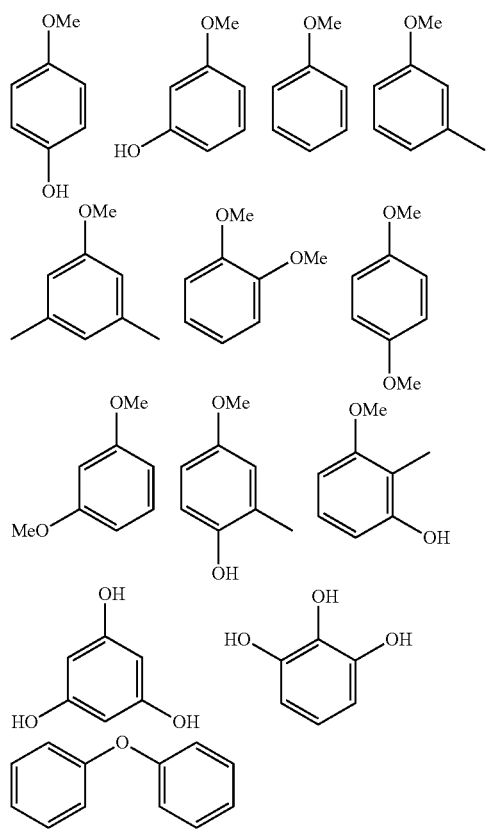

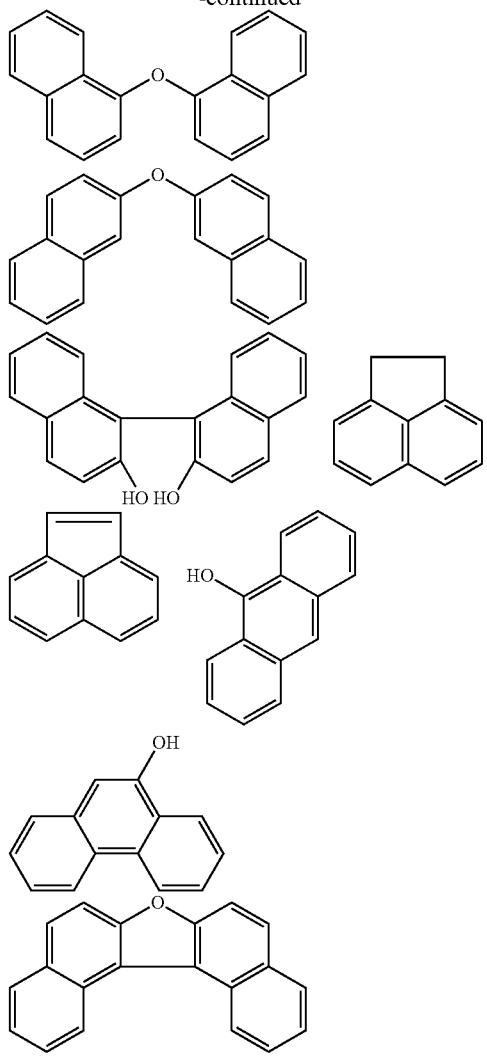

Further, illustrative example of other (C) aromatic ring containing resin includes: novolak resins of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, thymol, isothymol, 4,4'-(9H-fluorene-9-ylidene)bisphenol, 2,2'-dimethyl-4,4'-(9H-fluorene-9-ylidene)bisphenol, 2,2'-diallyl-4,4'-(9H-fluorene-9-ylidene)bisphenol, 2,2'-difluoro-4,4'-(9H-fluorene-9-ylidene)bisphenol, 2,2'-diphenyl-4,4'-(9H-fluorene-9-ylidene)bisphenol, 2,2'-dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-dial, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6, 6'-diol, 1-naphthol, 2-naphthol, 2-methyl-1-naphthol, 4-methoxy-1-naphthol, 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofurane, biphenyl, bisphenol, trisphenol, dicyclopentadiene, tetrahydroindene, 4-vinylcyclohexene, norbornadiene, 5-vinylnorborna-2-ene, α-pinene, β-pinene, and limonene; and polyhydroxystyrene, polystyrene, polyvinylnaphthalene, polyvinylanthracene, poiyvinylcarbazole, polyindene, polyacenaphthylene, polynorbornene, polycyclodecene, polytetracyclododecene, polynortricyclene, and poly(meth)acrylate, or a copolymer of them. In addition, a resin (C3) obtained by polycondensation of one or two or more afore-mentioned aromatic ring containing compounds with benzophenone, naphthophenone, or fluorenone may be used. When this resin (C3) is blended into the organic film composition, not only the flattening performance and the etching resistance but also the heat resistance thereof is enhanced so high in a certain instance that this resin is preferable particularly for the use that requires the heat resistance.

Other Components

In addition, it is preferable that the organic film composition comprises (D) a phenolic hydroxyl group containing compound as necessary. As to this (D) phenolic hydroxyl group containing compound, a compound shown by the general formula (2a) or (2b) is preferable. Further, illustrative example that can be used therein includes phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 1-naphthol, 2-naphthol, 1-anthracenol, 1-pyrenol, and 9-phenanthrenol.

If the organic film composition contains (D) the phenolic hydroxyl group containing compound, the filling-up characteristics or the flattening characteristics can be further enhanced in a certain instance.

In addition, (E) an acid generator and (F) a crosslinking agent may be added into the organic film composition in order to facilitate a thermal crosslinking reaction further.

(E) An acid generator generates an acid by thermal decomposition or by exposure to a light; and any of them can be added. Specific example thereof may be found in the paragraphs of [0061] to [0065] of the Japanese Patent Laid-Open Publication No. 2007-199653.

Examples of (F) the crosslinking agent that can be added into the organic film composition may be found in the paragraphs of [0055] to [0060] of the Japanese Patent Laid-Open Publication No. 2007-199653.

In addition, into the organic film composition, (G) a surfactant may be added to improve a coating property thereof during spin coating. Examples of the surfactant may be found in the paragraphs of [0142] to [0147] of the Japanese Patent Laid-Open Publication No. 2009269953.

Further, into the organic film composition, a basic compound may be added to improve the storage stability thereof. This basic compound plays a role as a quencher of a minute amount of the acid that is generated from an acid generator thereby preventing progress of a crosslinking reaction by this acid from occurring. Specific examples of the basic compound like this may be found in the paragraphs of [0086] to [0090] of the Japanese Patent Laid-Open Publication No. 2007-199653.

The organic film composition as mentioned above has both the high etching resistance and the excellent filling-up and flattening characteristics; and thus, this can be used excellently as a resist underlayer film composition or a flattening composition for manufacturing of a semiconductor device. Hereunder, a method for forming an organic film and a patterning process by using the organic film composition will be explained by showing examples.

Method for Forming the Organic Film

When an organic film used as a resist underlayer film or as a flattening film for manufacturing of a semiconductor of a multilayer resist film used in a lithography is formed by using the organic film composition, for example, a method wherein the organic film is formed by applying the organic film composition onto a substrate to be processed followed by heat treatment of this composition in the temperature range of 200° C. or higher to 600° C. or lower for the period of 10 to 600 seconds to effect the curing may be used.

In the method for forming an organic film, the foregoing organic film composition is applied onto a substrate to be processed by a method such as a spin coating method. By using a method such as a spin coating method, the excellent filling-up characteristics can be obtained. After the spin coating, baking is carried out in order to evaporate a solvent and to prevent mixing thereof with a resist upper layer film and with a resist middle layer film from occurring and to facilitate a crosslinking reaction. Baking is done in the temperature range of 200° C. or higher to 600° C. or lower for the period of 10 to 600 seconds or preferably 10 to 300 seconds. The temperature for baking is preferably in the range of 250° C. or higher to 500° C. or lower. In view of the device damage and the effect to the wafer deformation, the upper limit of the heating temperature in the lithography wafer process is preferably 600° C. or lower, or more preferably 500° C. or lower.

Alternatively, according to the method for forming an organic film, for example, the organic film may be formed by applying the organic film composition onto a substrate to be processed by a method such as a spin coating method similarly to the above, followed by baking of the composition under an atmosphere of an oxygen concentration range of 0.1% or more to 21% or less to effect the curing.

By baking the organic film composition under the oxygen atmosphere as mentioned above, an adequately cured film can be obtained.

This baking may be done under atmosphere of an air or with introduction of an inert gas such as $N_2$, Ar, and He to an air. The baking temperature and so on may be the same as those mentioned above.

The method as mentioned above for forming an organic film can give a flat cured film regardless of concavity and convexity present on the substrate to be processed because of its excellent filling-up and flattening characteristics, so that this is especially useful for forming a flat cured organic film on the substrate having a structural body with a height of 30 nm or more or with different levels.

Thickness of this organic film used as the resist underlayer film or as the flattening film for manufacturing of a semiconductor device can be selected as appropriately, though it is preferable in the range of 30 to 20,000 nm or in particular 50 to 15,000 nm.

When the organic film formed as mentioned above is used as a resist underlayer film of a three-layer process, a silicon-containing resist middle layer film may be formed thereupon, and then a silicon-uncontaining resist upper layer film may be formed.

The organic film composition is extremely useful as the resist underlayer film composition for multilayer resist processes such as a silicon-containing bilayer resist process, a three-layer resist process using a silicon-containing middle layer film, and a four-layer resist process using an inorganic hard mask middle layer film and an organic anti-reflective film.

Patterning Process

The present invention provides, as a patterning process using the resist underlayer film composition as mentioned above, a patterning process on a substrate to be processed by a lithography, wherein, at least, a resist underlayer film is formed on a substrate to be processed by using the foregoing organic film composition, on this resist underlayer film is formed a resist middle layer film by using a resist middle layer film composition which contains a silicon atom, on this resist middle layer film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the resist middle layer film is etched by using the obtained resist pattern as an etching mask, the resist underlayer film is etched by using the obtained resist middle layer film pattern as an etching mask, and the substrate to be processed is etched by using the obtained resist underlayer film pattern as an etching mask, thereby forming a pattern on the substrate to be processed.

As to the silicon-containing resist middle layer film of the three-layer resist process, the middle layer film based on a polysilsesquioxane is also used preferably. By providing the resist middle layer film with an anti-reflective function, reflection can be suppressed. Especially when a composition containing a large quantity of an aromatic group thereby having a high substrate etching resistance is used for the resist underlayer film for exposure to the 193-nm light, the k-value thereof becomes higher thereby leading to increase in the substrate reflection; however, by suppressing the reflection by the resist middle layer film, the substrate reflection can be made 0.5% or less. As to the resist middle layer film having the anti-reflective effect, preferably used is a polysilsesquioxane that is crosslinkable by an acid or a heat and has, as the light-absorbing pendant, an anthracene for exposure to the 248-nm and 157-nm lights and a phenyl group or a silicon-silicon bond for exposure to the 193-nm light.

In this case, for formation of the silicon-containing resist middle layer film, a spin coating method is more advantageous than a CVD method because it is more convenient and less costly.

Alternatively, an inorganic hard mask middle layer film may be formed as the middle layer film. In this case, the patterning is done as follows: at least, a resist underlayer film is formed on a substrate to be processed by using the foregoing organic film composition, on this resist underlayer film is formed any inorganic hard mask middle layer film selected from a silicon oxide film, a Silicon nitride film, and a silicon oxynitride film, on this inorganic hard mask middle layer film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the inorganic hard mask middle layer film is etched by using the obtained resist pattern as an etching mask, the resist underlayer film is etched by using the obtained inorganic hard mask middle layer film pattern as an etching mask, and the substrate to be processed is etched by using the obtained resist underlayer film pattern as an etching mask, thereby forming a pattern on the substrate to be processed.

In the case that as mentioned above an inorganic hard mask middle layer film is formed on a resist upper layer film, the silicon oxide film, the silicon nitride film, or the silicon oxynitride film (SiON film) is formed by a CVD method or an ALD method. For example, the method for forming the nitride film is described in the Japanese Patent Laid-Open Publication No. 2002-334869 and the International Patent Laid-Open Publication No. 2004/066377. Here, film thickness of the inorganic hard mask middle layer film is in the range of 5 to 200 nm, or preferably 10 to 100 nm; and among the foregoing films, the SiON film is most preferably used because it has a high anti-reflective effect. During formation of the SiON film, the substrate temperature is in the range of 300 to 500° C.; and thus, the underlayer film thereof needs to sustain the temperature of 300 to 500° C. The resist underlayer film composition has the high heat stability, so that it can sustain the high temperature of 300 to 500° C.; and thus, a combination of the inorganic hard mask formed by a CVD method or an ALD method with the resist underlayer film formed by a spin coating method becomes possible.

In addition, the present invention is suitable for a four-layer resist process using an anti-reflective film. In this case, the patterning is done as follows: at least, a resist underlayer film is formed on a substrate to be processed by using the organic film composition, on this resist underlayer film is formed any inorganic hard mask middle layer film selected from a silicon oxide film, a silicon nitride film, and a silicon oxynitride film, on this inorganic hard mask middle layer film is formed an organic anti-reflective film is formed, on this organic anti-reflective film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the organic anti-reflective film and the inorganic hard mask middle layer film are etched by using the obtained resist pattern as an etching mask, the resist underlayer film is etched by using the obtained inorganic hard mask middle layer film pattern as an etching mask, and the substrate to be processed is etched by using the obtained resist underlayer film pattern as an etching mask, thereby forming a pattern on the substrate to be processed.

Here, a photoresist film may be formed as the resist upper layer film on the inorganic hard mask middle layer film; but, as shown above, on the inorganic hard mask middle layer film may be formed the organic anti-reflective film (BARC) by a spin coating method followed by formation of the photoresist film thereupon. Especially when the SiON film is formed as the inorganic hard mask middle layer film, owing to two anti-reflective layers of the SiON film and the BARC film, reflection can be suppressed even in the immersion exposure with high. NA of 1.0 or more. One additional merit of forming the BARC film resides in the effect that a footing profile of the photoresist pattern on immediately above the SiON film can be suppressed.

The resist upper layer film in the three-layer resist film may be any of a positive type and a negative type; and the same composition as a usually used photoresist composition may be used. In the case that a monolayer resist upper layer film is formed by the photoresist composition mentioned above, a spin coating method is used similarly to formation of the resist underlayer film as mentioned above. After spin coating by using the photoresist composition, pre-baking is done preferably in the temperature range of 60 to 180° C. for the period of 10 to 300 seconds. Thereafter, by following usually used procedures, i.e., photo-exposure, post-exposure bake (PEB), and development are carried out to obtain a resist pattern. Meanwhile, thickness of the resist upper layer film is not particularly restricted, but preferably in the range of 30 to 500 nm, in particular 50 to 400 nm.

Illustrative example of the exposure light includes a far UV beam, a KrF excimer laser beam (248 nm), an ArF excimer laser beam (193 nm), an $F_2$ laser beam (157 nm), a $Kr_2$ laser beam (146 nm), an $Ar_2$ laser beam (126 nm), a soft X-ray (EUV), an electron beam (EB), an ion beam, and an X-ray.

Next, etching is carried out by using the obtained resist pattern as a mask. Etching of the resist middle layer film or the inorganic hard mask middle layer film in the three-layer process is carried out by using the resist pattern as a mask by using a chlorofluorocarbon gas.

Then, the resist underlayer film is etched by using the resist middle layer film pattern or the inorganic hard mask middle layer film pattern as a mask.

The silicon-containing resist middle layer film has the etching resistance by an oxygen gas or a hydrogen gas; and thus, it is preferable that etching of the resist underlayer film by using as a mask the resist middle layer film pattern obtained as mentioned above be carried out by an etching gas comprising mainly an oxygen gas or a hydrogen gas.

Similarly, etching of the resist underlayer film by using the inorganic hard mask middle layer film pattern as a mask may be carried out by an etching gas comprising mainly an oxygen gas or a hydrogen gas.

The subsequent etching of the substrate to be processed may be done by a usually used method; for example, the substrate to be processed is etched by a gas comprising mainly a chlorofluorocarbon gas if the substrate is formed of $SiO_2$, SiN, or a silica insulating film, and by a gas comprising mainly a chlorine gas or a bromine gas if the substrate is formed of p-Si, Al, or W. If the substrate to be processed is etched by a chlorofluorocarbon gas system, the silicon-containing middle layer film of the three-layer process is removed simultaneously with etching of the substrate to be processed. If the substrate is etched by a chlorine gas system or a bromine gas system, the silicon-containing middle layer film needs to be removed separately by dry etching by using a chlorofluorocarbon gas system after etching of the substrate.

The resist underlayer film has the characteristic of an excellent etching resistance during the time of etching of these substrates to be processed.

Meanwhile, the substrate to be processed is not particularly restricted; and thus, substrates such as Si, α-Si, p-Si, $SiO_2$, SiN, SiON, W, TiN, and Al, as well as these substrates that are coated with a layer to be processed, may be used. As to the layer to be processed, various low-k films such as Si, $SiO_2$, SiON, SiN, p-Si, Si, W, W—Si, Al, Cu, and Al—Si, as well as stopper films thereof, may be used with the film thickness thereof being usually in the range of 50 to 10,000 nm, in particular 100 to 5,000 nm. Meanwhile, in the case that the layer to be processed is formed, different materials are used between the substrate and the layer to be processed.

Hereunder, one embodiment of the three-layer resist process will be shown specifically as following by referring to FIG. 1.

In the case of the three-layer resist process, as shown in FIG. 1(A), after the resist underlayer film 3 is formed by using the organic film composition on the layer to be processed 2 that is laminated on the substrate 1, the resist middle layer film 4 is formed, and then the resist upper layer film 5 is formed thereupon.

Next, as shown in FIG. 1(B), the prescribed area 6 of the resist upper layer film is exposed, which is then followed by PEB and development to form the resist pattern 5a (FIG. 1(C)). By using this obtained resist pattern 5a as a mask, the resist middle layer film 4 is etched by using a chlorofluorocarbon gas to form the resist middle layer film pattern 4a (FIG. 1(D)). After the resist pattern 5a is removed, by using this obtained resist middle layer film pattern 4a as a mask, the resist underlayer film 3 is etched by the oxygen plasma etching to obtain the resist underlayer film pattern 3a (FIG. 1(E)). Further, after the resist middle layer pattern 4a is removed, by using the resist underlayer film pattern 3a as a mask, the layer to be processed 2 is etched to form the pattern 2a (FIG. 1(F)).

In the case that the inorganic hard mask middle layer film is formed, the resist middle layer film 4 is the inorganic hard mask middle layer film; and in the case that the BARC is formed, the BARC is formed between the resist middle layer film 4 and the resist upper layer film 5. The BARC may be etched continuously before etching of the resist middle layer film 4; or alternatively, after only the BARC is etched, the resist middle layer film 4 may be etched by changing the etching equipment and so forth.

EXAMPLES

Hereinafter, the present invention will be explained more specifically by showing Examples and Comparative Examples; but the present invention is not limited by these descriptions.

Meanwhile, measurement of the molecular weight was done specifically by the following method. The weight-average molecular weight (Mw) and the number-average molecular weight (Mn) based on conversion to the polystyrene standard were obtained by the gel permeation chromatography (GPC) using tetrahydrofuran as the eluting solvent; and then the dispersity (Mw/Mn) was calculated. The weight reduction rate from 30° C. to 250° C. was obtained by the TG measurement (thermogravimetry) by using a differential thermogravimetry under a helium atmosphere with the temperature raising rate of 10° C./minute.

Synthesis Example 1

Synthesis of Heat-Decomposable Polymers Having an Acetal Structure

Synthesis Example 1-1

Synthesis of the Heat-Decomposable Polymer (A1) Shown by the Following Formula

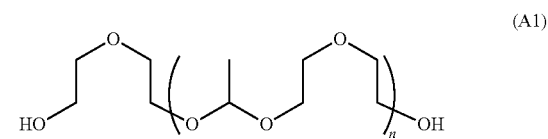

Into a mixture of 3.8 g of a cationic ion-exchange resin (Amberlyst (registered trade name) 15) and 100 g of ethyl acetate was added 100 g of diethylene glycol raonovinyl ether at room temperature; and then the resulting mixture was stirred further for three hours. After terminating the reaction by adding 0.8 g of triethylamine, the cationic ion-exchange resin was removed by filtration. The filtrate was concentrated under reduced pressure to obtain 100 g of the polymer (A1) as a highly viscous liquid (Mw=5,200 and Mw/Mn=2.64). The weight reduction rate of the polymer (A1) from 30° C. to 250° C. was 93% by mass.

Analysis results of $^1$H-NMR and $^{13}$C-NMR of the synthesized polymer (A1) are as follows.

$^1$H-NMR (600 mHz in DMSO-d6):

δ=1.78 (51H, d, J=5.1 Hz), 3.40 to 3.65 (136H, m), 4.52 (2H, t, J=5.5 Hz), and 4.70 (17H, q, H=5.1 Hz)

From the above $^1$H-NMR analysis result, n=17. $^{13}$C-NMR (150 MHz in DMSO-d6):

δ=19.60, 60.23, 64.04, 69.88, 72.33, and 99.29.

Synthesis Examples 1-2 and 1-3

Synthesis of the Heat-Decomposable Polymers (A2) and (A-3) Shown by the Following Formulae

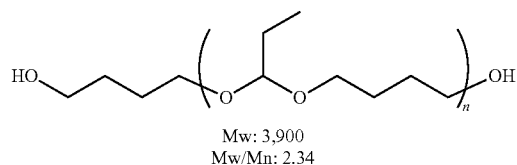

Mw: 3,900
Mw/Mn: 2.34

(A2)

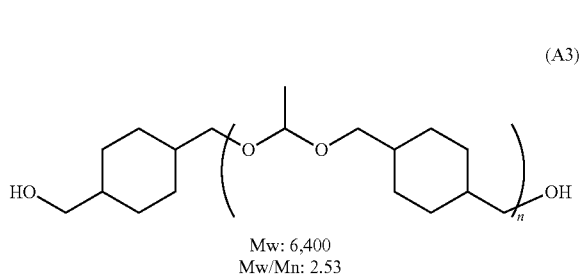

Mw: 6,400
Mw/Mn: 2.53

(A3)

The polymers (A2) and (A3) were synthesized similarly to the method of Synthesis Example 1-1 except that different raw materials were used. The weight reduction rates of the polymers (A2) and (A3) from 30° C. to 250° C. were 95% and 80% by mass, respectively.

In addition, a polymer shown by the following formula was used as the heat-decomposable polymer (A4).

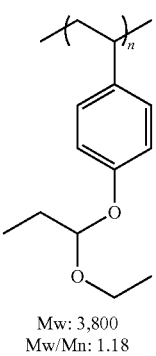

Mw: 3,800
Mw/Mn: 1.18

(A4)

The weight reduction rate of the heat-decomposable polymer (A4) from 30° C. to 250° C. was 42% by mass.

Synthesis Example 1-4

Synthesis of the Heat-Decomposable Polymer (M) Shown by the Following Formula (A5)

Mw: 3,200
Mw/Mn: 1.97

A mixture of 20.0 g of 1-naphthol, 21.2 g of triethylene glycol, 0.6 g of pyridinium p-toluenesulfonate, and 60.0 g of toluene was heated under reflux for 20 hours with removing generated water by distillation. After 1.3 g of triethylamine and 40.0 g of toluene were added thereinto, a usual aqueous work-up was carried out. After concentration under reduced pressure, 34.1 g of the polymer (A5) was obtained as a highly viscous liquid. The weight reduction rate of the polymer (A5) from 30° C. to 250° C. was 41% by mass.

Analysis result of $^1$H-NMR of the synthesized polymer (A5) is as follows.

$^1$H-NMR (600 MHz in DMSO-d6)

δ=3.3 to 3.8 (48H, m), 4.4 to 4.6 (2H, m), 6.0 to 6.2 (3H, m), and 7.3 to 8.7 (21H, m)

From the above $^1$H-NMR analysis result, n=3.

Synthesis Example 1-5

Synthesis of the Heat-Decomposable Polymer (A6) Shown by the Following Formula

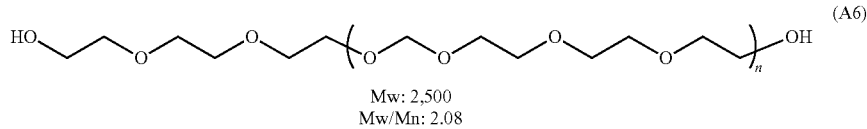

Mw: 2,500
Mw/Mn: 2.08

A mixture of 31.2 g of ethylal, 30.0 g of triethylene glycol, 0.2 g of a cationic ion-exchange resin (Amberlyst (trade name) 15), and 55.0 g of toluene was heated under reflux for 16 hours with removing the fraction having the boiling point of 80° C. or lower by distillation. After 0.4 g of triethylamine and 20.0 g of toluene were added thereinto to terminate the reaction, the cationic ion-exchanged resin was removed by filtration. The filtrate was concentrated under reduced pressure to obtain 32.0 g of the polymer (A6) as a highly viscous liquid. The weight reduction rate of the polymer (A6) from 30° C. to 250° C. was 80% by mass.

Analysis result of $^1$H-NMR of the synthesized polymer (A6) is as follows.

$^1$H-NMR (600 MHz in DMSO-d6):

δ=1.1 (6H, t, J=7.2 Hz), 3.9 to 4.2 (100H, m), and 4.6 to 4.7 (16H, m)

From the above $^1$H-NMR analysis result, n=8.

Comparative polymer: Thermally undecomposable polymer (B1) shown by the following formula.

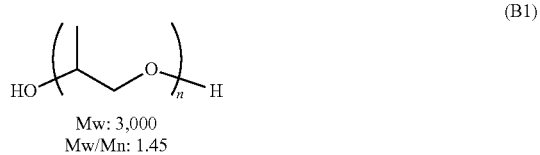

Mw: 3,000
Mw/Mn: 1.45

The weight reduction rate of the thermally undecomposable polymer (B1) from 30° C. to 250° C. was 2% by mass.

Preparation of Resist Underlayer Film Compositions: UDL-1 to UDL-10 and Comparative UDL-1 to Comparative UDL-5

Each of the foregoing heat-decomposable polymers (A1) to (A6), the thermally undecomposable polymer (B1), the aromatic ring containing resins (R1) to (R5), the acid generator shown by AG1, the crosslinking agent shown by CR1, and the solvents were dissolved in the solvent containing 0.1% by mass of FC-4430 (manufactured by Sumitomo 3M Limited) with the ratio shown in Table 1; and then, the resulting mixture was filtrated through a 0.1-μm filter made of a fluorinated resin to obtain each of the organic film compositions (resist underlayer film compositions: UDL-1 to UDL-10 and Comparative UDL-1 to Comparative UDL-5).

TABLE 1

| Resist underlayer film composition | Polymer (parts by mass) | Base resin (parts by mass) | Crosslinking agent (parts by mass) | Acid generator (parts by mass) | Solvent (parts by mass) |
| --- | --- | --- | --- | --- | --- |
| UDL-1 | A1 (10) | R1 (10) | | | PGMEA (63)/ cyclohexanone (27) |
| UDL-2 | A2 (10) | R1 (10) | | | PGMEA (63)/ cyclohexanone (27) |

TABLE 1-continued

| Resist underlayer film composition | Polymer (parts by mass) | Base resin (parts by mass) | Crosslinking agent (parts by mass) | Acid generator (parts by mass) | Solvent (parts by mass) |
| --- | --- | --- | --- | --- | --- |
| UDL-3 | A3 (10) | R1 (10) | | | PGMEA (63)/ cyclohexanone (27) |
| UDL-4 | A1 (10) | R2 (10) | | | PGMEA (90) |
| UDL-5 | A1 (10) | R3 (10) | CR1 (2) | AG1 (1) | PGMEA (90) |
| UDL-6 | A4 (5) | R3 (10) | CR1 (2) | AG1 (1) | PGMEA (90) |
| UDL-7 | A5 (10) | R1 (10) | | | PGMEA (63)/ cyclohexanone (27) |
| UDL-8 | A6 (10) | R1 (10) | | | PGMEA (63)/ cyclohexanone (27) |
| UDL-9 | A1 (10) | R4 (10) | | | PGMEA (90) |
| UDL-10 | A1 (10) | R5 (10) | | | PGMEA (90) |
| Comparative UDL-1 | None | R1 (10) | | | PGMEA (63)/ cyclohexanone (27) |
| Comparative UDL-2 | None | R2 (10) | | | PGMEA (90) |
| Comparative UDL-3 | None | R3 (10) | CR1 (2) | AG1 (1) | PGMEA (90) |
| Comparative UDL-4 | B1 (10) | R1 (10) | | | PGMEA (63)/ cyclohexanone (27) |
| Comparative UDL-5 | B1 (2) | R1 (10) | | | PGMEA (63)/ cyclohexanone (27) |

PGMEA: Propylene glycol monomethyl ether acetate

The aromatic ring containing base resins (R1) to (R5), the acid generator AG 1, and the crosslinking agent CR 1 that were used here are shown below.

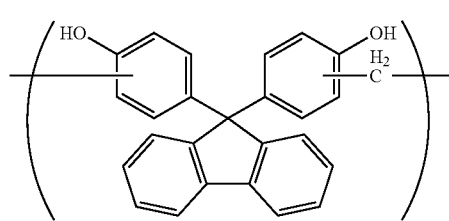
(R1)
Mw: 22,000
Mw/Mn: 4.20
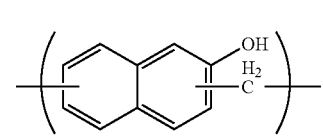
(R2)
Mw: 19,500
Mw/Mn: 3.80
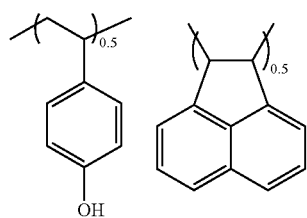
(R3)
Mw: 10,200
Mw/Mn: 1.67
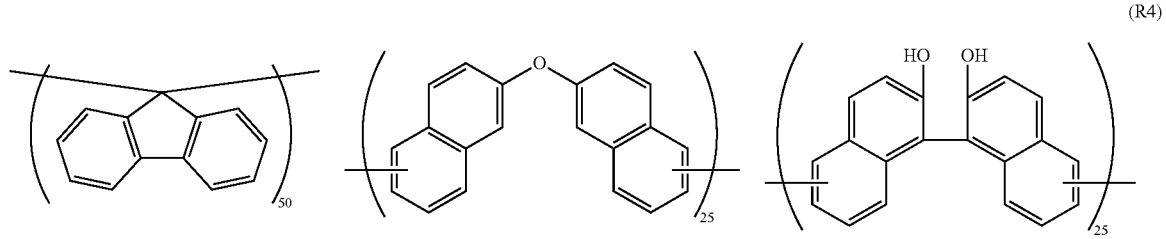
(R4)
Mw: 3,600
Mw/Mn: 2.33
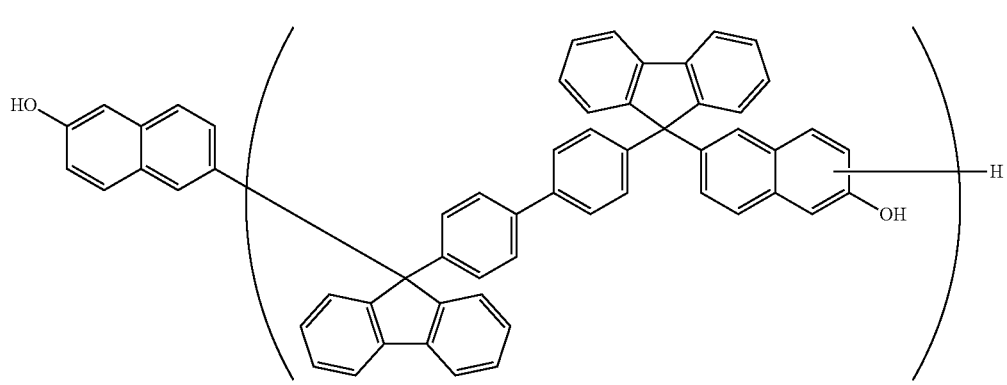
(R5)
Mw: 1,000
Mw/Mn: 1.64
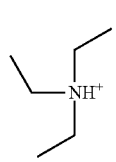
AG1
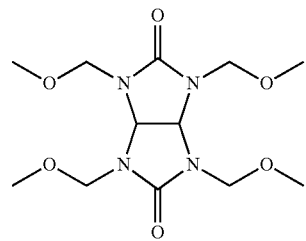
CR1

Measurement of the Solvent Resistance: Examples 1-1 to 1-10 and Comparative Examples 1-1 to 1-5

Each of the resist underlayer film compositions prepared above (UDL-1 to UDL-10 and Comparative UDL-1 to Comparative UDZ-5) was applied on a silicon substrate and baked under the condition shown in Table 2; and then the film thickness thereof was measured. Thereafter, the PGMEA solvent was dispensed, allowed to stand for 30 seconds, spin-dried, and baked at 100° C. for 60 seconds to evaporate PGMEA; and then film thickness was measured to obtain the difference in the film thicknesses before and after the PGMEA treatment.

TABLE 2

| Resist underlayer film composition | Film thickness after film formation: a (angstrom) | Film thickness after PGMEA treatment: b (angstrom) | b/a × 100 (%) | Bake temperature |
|---|---|---|---|---|
| Example 1-1 | UDL-1 | 2892 | 2891 | 100 | 350° C. × 60 seconds |
| Example 1-2 | UDL-2 | 2791 | 2790 | 100 | 350° C. × 60 seconds |
| Example 1-3 | UDL-3 | 2928 | 2927 | 100 | 350° C. × 60 seconds |
| Example 1-4 | UDL-4 | 2913 | 2910 | 100 | 350° C. × 60 seconds |
| Example 1-5 | UDL-5 | 2928 | 2926 | 100 | 250° C. × 60 seconds |
| Example 1-6 | UDL-6 | 2980 | 2981 | 100 | 250° C. × 60 seconds |
| Example 1-7 | UDL-7 | 2892 | 2891 | 100 | 350° C. × 60 seconds |
| Example 1-8 | UDL-8 | 2791 | 2790 | 100 | 350° C. × 60 seconds |
| Example 1-9 | UDL-9 | 2946 | 2946 | 100 | 400° C. × 60 seconds |
| Example 1-10 | UDL-10 | 2938 | 2937 | 100 | 400° C. × 60 seconds |
| Comparative Example 1-1 | Comparative UDL-1 | 2781 | 2779 | 100 | 350° C. × 60 seconds |
| Comparative Example 1-2 | Comparative UDL-2 | 2956 | 2955 | 100 | 350° C. × 60 seconds |
| Comparative Example 1-3 | Comparative UDL-3 | 2762 | 2760 | 100 | 250° C. × 60 seconds |
| Comparative Example 1-4 | Comparative UDL-4 | Poor film-formation | | | 350° C. × 60 seconds |
| Comparative Example 1-5 | Comparative UDL-5 | 2928 | 2925 | 100 | 350° C. × 60 seconds |

As shown in Table 2, in all of the resist underlayer film compositions, not only the film property was excellent (mirror-like) but also the film loss by the solvent treatment hardly occurred; and thus, it was confirmed that the obtained film had the excellent solvent resistance. On the contrary, in Comparative UDL-4 in which a considerable amount of the thermally undecomposable polymer (B1) was blended, the film property was poor (fogged glass-like); and thus, reduction in the blending amount thereof was necessary.

Etching Tests Under the $CF_4/CHF_3$ Gas System: Examples 2-1 to 2-10 and Comparative Examples 2-1 to 2-4

The resist underlayer film was formed similarly to the above; and then the etching test thereof in the $CF_4/CHF_3$ gas system was carried out under the condition shown below.

Etching Condition:

| Chamber pressure | 40.0 Pa |
| RF power | 1,300 W |
| $CHF_3$ gas flow rate | 30 mL/minute |
| $CF_4$ gas flow rate | 30 mL/minute |
| Ar gas flow rate | 100 mL/minute |
| Time | 60 seconds |

The film thicknesses before and after the etching were measured by using the etching instrument TE-8500 (manufactured by Tokyo Electron Ltd.). These results are shown in Table 3.

TABLE 3

| | Composition | Film thickness before etching: a (angstrom) | Film thickness after etching: a (angstrom) | b/a × 100 (%) |
|---|---|---|---|---|
| Example 2-1 | UDL-1 | 2892 | 1894 | 65.5 |
| Example 2-2 | UDL-2 | 2791 | 1792 | 64.2 |
| Example 2-3 | UDL-3 | 2928 | 1927 | 65.8 |
| Example 2-4 | UDL-4 | 2913 | 1816 | 62.3 |
| Example 2-5 | UDL-5 | 2928 | 1976 | 67.5 |
| Example 2-6 | UDL-6 | 2980 | 1892 | 63.5 |
| Example 2-7 | UDL-7 | 2892 | 1894 | 65.5 |
| Example 2-8 | UDL-8 | 2791 | 1792 | 65.5 |
| Example 2-9 | UDL-9 | 2946 | 2092 | 71.0 |
| Example 2-10 | UDL-10 | 2938 | 2062 | 70.2 |
| Comparative Example 2-1 | Comparative UDL-1 | 2781 | 1785 | 64.2 |
| Comparative Example 2-2 | Comparative UDL-2 | 2956 | 1853 | 62.7 |
| Comparative Example 2-3 | Comparative UDL-3 | 2762 | 1815 | 65.7 |
| Comparative Example 2-4 | Comparative UDL-5 | 2928 | 1723 | 58.8 |

As shown in Table 3, it was confirmed that the resist underlayer film compositions (UDL-1 to UDL-5, UDL-7, and UDL-8) have the same etching resistance as the corresponding comparative underlayer film compositions not containing the heat-decomposable polymer (UDL-1 to UDL-3, UDL-7, and UDL-8 correspond to Comparative UDL-1, UDL-4 corresponds to Comparative UDL-2, and UDL-5 corresponds to the Comparative UDL-3).

In addition, the etching resistance of the resist underlayer film composition (UDL-6) was lower as compared to that of the corresponding comparative underlayer film composition (Comparative UDL-3); but the deterioration was in the level not significantly affecting a practical use thereof as compared with the case that (B1) was added.

On the contrary, in Comparative UDL-5 in which a small amount of the thermally undecomposable polymer (81) was blended, the ratio of the remained film thickness after etching was smaller as compared with Comparative UDL-1 in which (B1) was not blended; and thus, it was confirmed that blending of a small amount of the thermally undecomposable polymer causes deterioration of the etching resistance.

Evaluation of the Filling-Up Characteristics: Examples 3-1 to 3-10 and Comparative Examples 3-1 to 3-4

Figure 2:
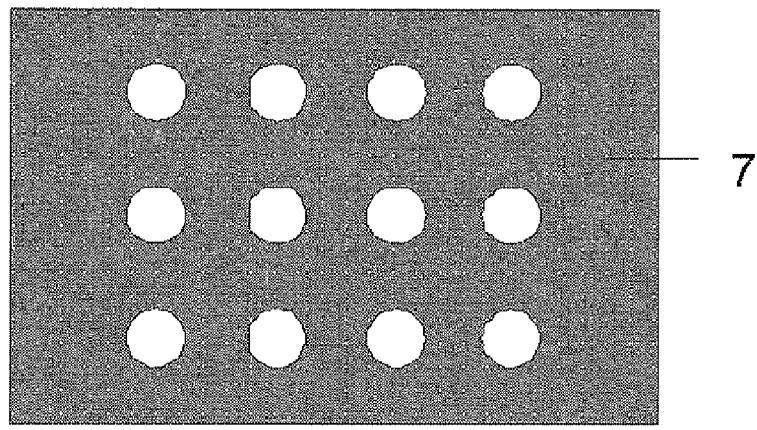
FIG. 2
This is an explanatory drawing with regard to the evaluation method of filling-up characteristics.
Figure 2:
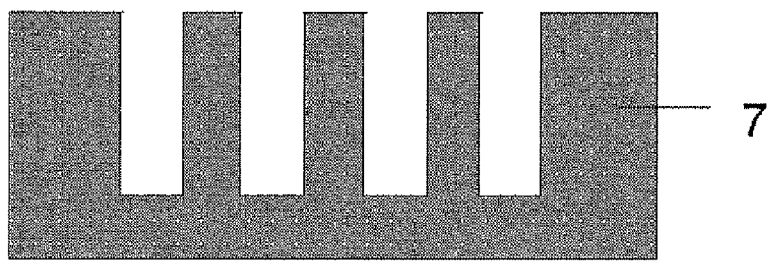
Figure 2:
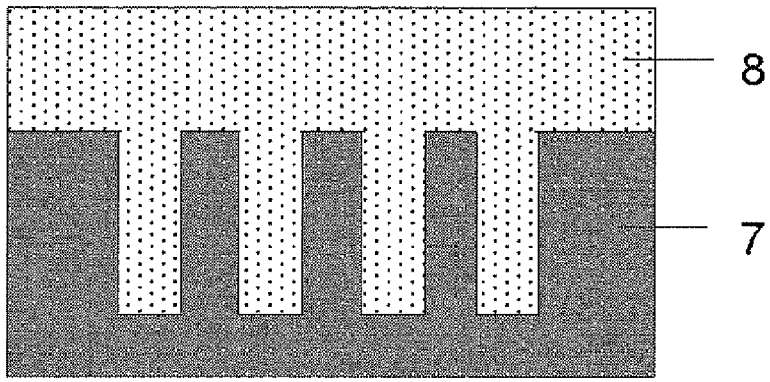

As shown in FIG. 2, each of the resist underlayer film compositions mentioned above was applied onto a $SiO_2$ wafer substrate having a dense hole pattern (0.16 μm of the hole diameter, 0.50 μm of the hole depth, and 0.32 μm of the distance between the central positions of neighboring two holes), and it was then heated on a hot plate at 180° C. for 60 seconds to obtain the resist underlayer film 8. The substrate used here was the underlayment substrate 7 ($SiO_2$ wafer substrate) having the dense hole pattern as shown in FIG. 2(G)

(bird's eye view) and FIG. 2(H) (cross sectional view). The cross sectional form of each of the obtained wafer substrates was checked by a scanning electron microscope (SEM) as to whether or not inside the hole was filled by the resist underlayer film without a void. In this evaluation, the results are shown in Table 4. In this evaluation, the resist underlayer film composition that is poor in its filling-up characteristics forms a void inside the hole. In the resist underlayer film composition that is excellent in its filling-up characteristics, inside the hole is filled up by the resist underlayer film without a void in this evaluation as shown in FIG. 2(I).

TABLE 4

| | Composition | Presence of void |
|---|---|---|
| Example 3-1 | UDL-1 | No |
| Example 3-2 | UDL-2 | No |
| Example 3-3 | UDL-3 | No |
| Example 3-4 | UDL-4 | No |
| Example 3-5 | UDL-5 | No |
| Example 3-6 | UDL-6 | No |
| Example 3-7 | UDL-7 | No |
| Example 3-8 | UDL-8 | No |
| Example 3-9 | UDL-9 | No |
| Example 3-10 | UDL-10 | No |
| Comparative Example 3-1 | Comparative UDL-1 | Yes |
| Comparative Example 3-2 | Comparative UDL-2 | Yes |
| Comparative Example 3-3 | Comparative UDL-3 | Yes |
| Comparative Example 3-4 | Comparative UDL-5 | No |

As shown in Table 4, the resist underlayer film compositions (UDL-1 to UDL-10) can fill up the hole pattern without a void; and thus, the excellent filling-up characteristics were confirmed as compared with the comparative underlayer film compositions not blended with the heat-decomposable polymers (Comparative UDL-1 to Comparative UDL-3).

Evaluation of the Flattening Characteristics; Examples 4-1 to 4-10 and Comparative Examples 4-1 to 4-4

Figure 3:
FIG. 3
This is an explanatory drawing with regard to the evaluation method of flattening characteristics.
Figure 3:
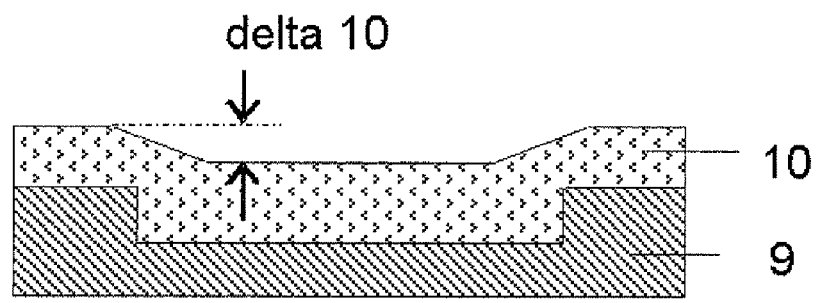

Each of the resist underlayer film compositions mentioned above was applied onto a underlayment substrate 9 (SiO$_2$ wafer substrate) having an isolated giant trench pattern (the trench width of 10 μm and the trench depth of 0.50 μm, as shown in FIG. 3(J)) and then baked under the condition shown in Table 5; and then, the difference in film thicknesses of the resist underlayer film 10 between the trench part and the non-trench part (delta 10 in FIG. 3 (K)) was checked by using a scanning electron microscope (SEM). The results are shown in Table 5. In this evaluation, the flattening characteristics are judged better when the difference in the film thicknesses therebetween is smaller. Meanwhile, in this evaluation method, the trench pattern having the depth of 0.50 μm was made flat by using the resist underlayer film composition giving the normal film thickness of 0.3 μm; and thus the evaluation was made under the especially severe evaluation condition in order to clearly see the difference in the flattening characteristics.

TABLE 5

| | Composition | Bake temperature | Difference in film thickness (nm) |
|---|---|---|---|
| Example 4-1 | UDL-1 | 180° C. × 60 seconds + 350° C. × 60 seconds | 150 |

TABLE 5-continued

| | Composition | Bake temperature | Difference in film thickness (nm) |
|---|---|---|---|
| Example 4-2 | UDL-2 | 180° C. × 60 seconds + 350° C. × 60 seconds | 150 |
| Example 4-3 | UDL-3 | 180° C. × 60 seconds + 350° C. × 60 seconds | 160 |
| Example 4-4 | UDL-4 | 180° C. × 60 seconds + 350° C. × 60 seconds | 170 |
| Example 4-5 | UDL-5 | 180° C. × 60 seconds + 250° C. × 60 seconds | 150 |
| Example 4-6 | UDL-6 | 180° C. × 60 seconds + 250° C. × 60 seconds | 210 |
| Example 4-7 | UDL-7 | 180° C. × 60 seconds + 350° C. × 60 seconds | 170 |
| Example 4-8 | UDL-8 | 180° C. × 60 seconds + 350° C. × 60 seconds | 170 |
| Example 4-9 | UDL-9 | 180° C. × 60 seconds + 400° C. × 60 seconds | 30 |
| Example 4-10 | UDL-10 | 180° C. × 60 seconds + 400° C. × 60 seconds | 20 |
| Comparative Example 4-1 | Comparative UDL-1 | 180° C. × 60 seconds + 350° C. × 60 seconds | 290 |
| Comparative Example 4-2 | Comparative UDL-2 | 180° C. × 60 seconds + 350° C. × 60 seconds | 320 |
| Comparative Example 4-3 | Comparative UDL-3 | 180° C. × 60 seconds + 250° C. × 60 seconds | 280 |
| Comparative Example 4-4 | Comparative UDL-5 | 180° C. × 60 seconds + 350° C. × 60 seconds | 230 |

As shown in Table 5, the resist underlayer film compositions (UDL-1 to UDL-10) have a smaller difference in the film thicknesses of the resist underlayer film between the trench part and the non-trench part as compare with the comparative underlayer film compositions not blended with the heat-decomposable polymers (Comparative UDL-1 to Comparative UDL-3); and thus, the excellent flattening characteristics of the resist underlayer film compositions could be confirmed.

Patterning Tests: Examples 5-1 to 5-10

Each of the resist underlayer film compositions (UDL-1 to UDL-10) was applied onto the SiO$_2$ wafer substrate having a trench pattern (the trench width of 10 μm and the trench depth of 0.10 μm) and then baked under the condition shown in Table 8 to form the resist underlayer film. Then, the resist middle layer film composition SOG 1 was applied on it and then baked at 200° C. for 60 seconds to form the resist middle layer film having the film thickness of 35 nm; and then, the resist upper layer film composition of the SL resist for ArF was applied upon it and then baked at 105° C. for 60 seconds to form the photoresist film having the film thickness of 100 nm. The top coat composition for immersion (TC-1) was applied on the photoresist film and then baked at 90° C. for 60 seconds to form the top coat having the film thickness of 50 nm.

The propylene glycol ethyl ether solution of the following polymer with the concentration thereof being 2% was prepared as the resist middle layer film composition (SOG-1).

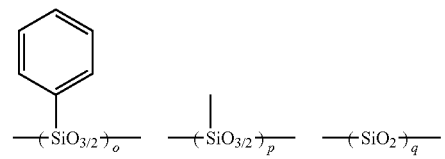

ArF Silicon-containing middle layer polymer 1
(o=0.20, p=0.50, q=0.30, and Mw=3,400)

The resin shown by ArF monolayer resist polymer 1, the acid generator PAG 1, and the basic compound amine 1 were dissolved into the solvent containing 0.1% by mass of FC-430 (manufactured by Sumitomo 3M Limited) with the ratio shown in Table 6; and then, the resulting mixture was filtrated through a 0.1-µm filter made of a fluorinated resin to obtain the resist upper layer film composition (SL resist for ArF).

TABLE 6

| No. | Polymer (parts by mass) | Acid generator (parts by mass) | Basic compound (parts by mass) | Solvent (parts by mass) |
|---|---|---|---|---|
| SL Resist for ArF | ArF monolayer resist polymer 1 (100) | PAG 1 (6.6) | amine 1 (0.8) | PGMEA (2,500) |

The ArF monolayer resist polymer 1, PAG 1, and amine 1, which were used here, are shown below.

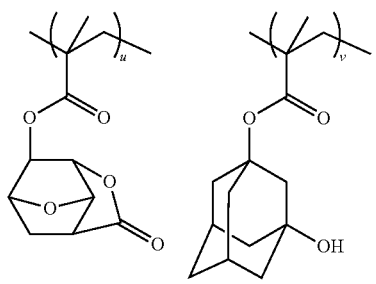

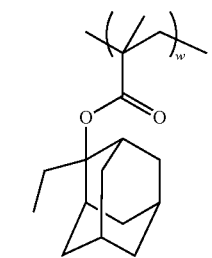

ArF monolayer resist polymer 1
(u=0.40, v=0.30, w=0.30, and Mw=7,800)

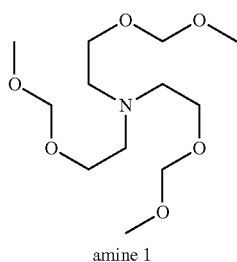

amine 1

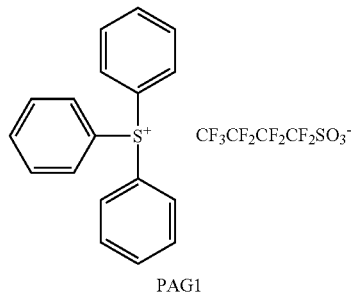

PAG1

The top coat polymer was dissolved in an organic solvent with the ratio shown in Table 7; and then, the resulting mixture was passed through a 0.1-µm filter made of a fluorinated resin to obtain the top coat composition for immersion (TC-1).

TABLE 7

| No. | Polymer (parts by mass) | Organic solvent (parts by mass) |
|---|---|---|
| TC-1 | Top coat polymer (100) | Diisoamyl ether (2,700) 2-Methyl-1-butanol (270) |

The top coat polymer used is shown below.
Top Coat Polymer:
Molecular weight (Mw): 8,800
Dispersity (Mw/Mn): 1.69

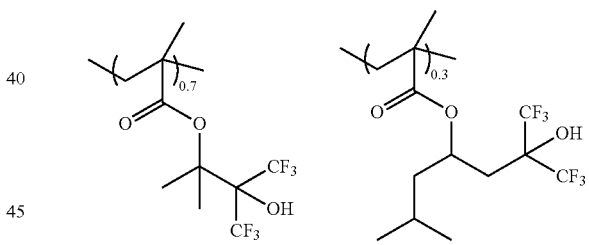

Top Coat Polymer

Then, after this was photo-exposed by using the ArF immersion exposure instrument NSR-S610C (NA of 1.30, σ of 0.98/0.65, 35-degree dipole s-polarized illumination, and 6% half tone phase shift mask, manufactured by Nikon Corp.), heat treatment (PEB) was done at 100° C. for 60 seconds, which was then followed by development by an aqueous tetramethyl ammonium hydroxide (TMAH) solution with the concentration thereof being 2.38% by mass for 30 seconds to obtain a 55-nm 1:1 positive line-and-space pattern.

Then, by using the etching instrument Telius (manufactured by Tokyo Electron Ltd.), the resist middle layer film was dry etched by using the resist pattern as a mask, by using the obtained resist middle layer film pattern as a mask the resist underlayer film was etched, and then by using the obtained resist underlayer film pattern as a mask the SiO$_2$ film was etched. Etching conditions are as shown below.

Transfer Condition of the Resist Pattern to the Resist Middle Layer Film:

| | |
|---|---|
| Chamber pressure | 10.0 Pa |
| RF power | 1,500 W |
| $CF_4$ gas flow rate | 75 sccm |
| $O_2$ gas flow rate | 15 sccm |
| Time | 15 seconds |

Transfer Condition of the Resist Middle Layer Film Pattern to the Resist Underlayer Film:

| | |
|---|---|
| Chamber pressure | 2.0 Pa |
| RF power | 500 W |
| Ar gas flow rate | 75 sccm |
| $O_2$ gas flow rate | 45 sccm |
| Time | 120 seconds |

Transfer Condition of the Resist Underlayer Film Pattern to the $SiO_2$ Film:

| | |
|---|---|
| Chamber pressure | 2.0 Pa |
| RF power | 2,200 W |
| $C_5F_{12}$ gas flow rate | 20 sccm |
| $C_2F_6$ gas flow rate | 10 sccm |
| Ar gas flow rate | 300 sccm |
| $O_2$ | 60 sccm |
| Time | 90 seconds |

The results of the pattern cross section checked by the electron microscope S-4700 (manufactured by Hitachi, Ltd.) are shown in Table 8.

TABLE 8

| | Composition | Bake temperature | Form after substrate transfer |
|---|---|---|---|
| Example 5-1 | UDL-1 | 180° C. × 60 seconds + 350° C. × 60 seconds | Vertical form |
| Example 5-2 | UDL-2 | 180° C. × 60 seconds + 350° C. × 60 seconds | Vertical form |
| Example 5-3 | UDL-3 | 180° C. × 60 seconds + 350° C. × 60 seconds | Vertical form |
| Example 5-4 | UDL-4 | 180° C. × 60 seconds + 350° C. × 60 seconds | Vertical form |
| Example 5-5 | UDL-5 | 180° C. × 60 seconds + 250° C. × 60 seconds | Vertical form |
| Example 5-6 | UDL-6 | 180° C. × 60 seconds + 250° C. × 60 seconds | Vertical form |
| Example 5-7 | UDL-7 | 180° C. × 60 seconds + 350° C. × 60 seconds | Vertical form |
| Example 5-8 | UDL-8 | 180° C. × 60 seconds + 350° C. × 60 seconds | Vertical form |
| Example 5-9 | UDL-9 | 180° C. × 60 seconds + 400° C. × 60 seconds | Vertical form |
| Example 5-10 | UDL-10 | 180° C. × 60 seconds + 400° C. × 60 seconds | Vertical form |

As shown in Table 8, in all of these cases, the upper resist pattern could be transferred finally to the substrate precisely; and thus, it was confirmed that the resist underlayer film composition can be excellently used even for microprocessing of a non-planar substrate by the multilayer resist process.

It must be noted here that the present invention is not limited to the embodiments as described above. The foregoing embodiments are mere examples; any form having substantially the same composition as the technical concept described in claims and showing similar effects is included in the technical scope of the present invention.

What is claimed is:

1. An organic film composition comprising (A) a heat-decomposable polymer, (B) an organic solvent, and (C) an aromatic ring containing resin, with the weight reduction rate of (A) the heat-decomposable polymer from 30° C. to 250° C. under a helium atmosphere with the temperature raising rate of 10° C./minute being 40% or more by mass, and (A) the heat-decomposable polymer comprises one or more compounds shown by the following general formulae (1a) to (1c),

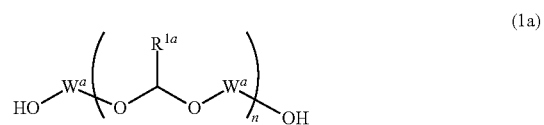

(1a)

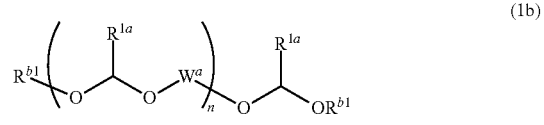

(1b)

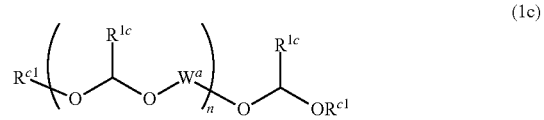

(1c)

wherein $R^{1a}$ represents an alkyl group having 1 to 4 carbon atoms;

$W^a$ represents a saturated or unsaturated divalent hydrocarbon group having 4 to 10 carbon atoms and optionally containing an ether bond;

each of $R^{b1}$ independently represents —$W^a$—OH, or an optionally substituted, saturated monovalent organic group having 1 to 30 carbon atoms;

$R^{1c}$ represents a hydrogen atom, an optionally substituted aryl group having 6 to 20 carbon atoms, or a heteroaryl group having 4 to 20 carbon atoms;

each of $R^{c1}$ independently represents an alkyl group having 1 to 4 carbon atoms, or —$W^a$—OH; and "n" represents an average number of the repeating unit, and is in the range of 3 to 500.

2. The organic film composition according to claim 1, wherein (A) the heat-decomposable polymer is in the state of liquid at 100° C. with the weight reduction rate thereof from 30° C. to 250° C. under a helium atmosphere with the temperature raising rate of 10° C./minute being 70% or more by mass.

3. The organic film composition according to claim 1, wherein (C) the aromatic ring containing resin contains a naphthalene ring.

4. The organic film composition according to claim 3, wherein (C) the aromatic ring containing resin comprises a resin (C1) that is obtained by polycondensation of any one or more compounds shown by the following general formulae (2a) and (2b) with a compound shown by the following general formula (3),

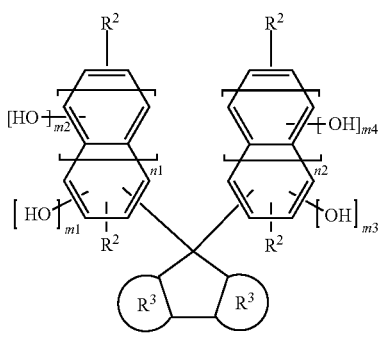
(2a)

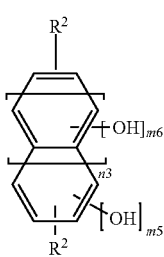
(2b)

wherein each of $R^2$ independently represents a hydrogen atom, or a saturated or unsaturated hydrocarbon group having 1 to 20 carbon atoms; each of $R^3$ independently represents a benzene ring or a naphthalene ring; each of m1+m2, m3+m4, and m5+m6 represents 1 or 2; each of n1, n2, and n3 represents 0 or 1,

A-CHO  (3)

wherein A represents any of a hydrogen atom, a hydrocarbon group having 1 to 10 carbon atoms, and an optionally substituted aromatic hydrocarbon group having 6 to 20 carbon atoms.

5. The organic film composition according to claim 4, wherein (C) the aromatic ring containing resin comprises a resin (C2) that has one or more repeating units shown by the following general formula (4),

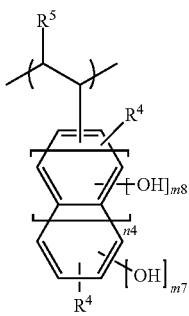
(4)

wherein each of $R^4$ independently represents a hydrogen atom, or a saturated or unsaturated hydrocarbon group having 1 to 20 carbon atoms; $R^5$ represents a hydrogen atom or may be bonded with one $R^4$ to form a ring; when $R^4$ and $R^5$ are bonded to form a ring, —$R^4$—$R^5$— represents a single bond or an alkylene group having 1 to 3 carbon atoms; m7+m8 represents 0, 1, or 2; and n4 represents 0 or 1.

6. The organic film composition according to claim 5, wherein (C) the aromatic ring containing resin comprises a resin (C3) that is obtained by polycondensation of one or two or more aromatic ring containing compounds with benzophenone, naphthophenone, or fluorenone.

7. The organic film composition according to claim 4, wherein (C) the aromatic ring containing resin comprises a resin (C3) that is obtained by polycondensation of one or two or more aromatic ring containing compounds with benzophenone, naphthophenone, or fluorenone.

8. The organic film composition according to claim 3, wherein (C) the aromatic ring containing resin comprises a resin (C2) that has one or more repeating units shown by the following general formula (4),

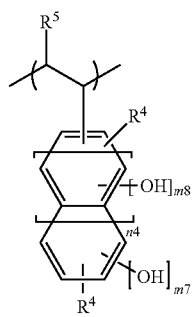
(4)

wherein each of $R^4$ independently represents a hydrogen atom, or a saturated or unsaturated hydrocarbon group having 1 to 20 carbon atoms; $R^5$ represents a hydrogen atom or may be bonded with one $R^4$ to form a ring; when $R^4$ and $R^5$ are bonded to form a ring, —$R^4$—$R^5$— represents a single bond or an alkylene group having 1 to 3 carbon atoms; m7+m8 represents 0, 1, or 2; and n4 represents 0 or 1.

9. The organic film composition according to claim 8, wherein (C) the aromatic ring containing resin comprises a resin (C3) that is obtained by polycondensation of one or two or more aromatic ring containing compounds with benzophenone, naphthophenone, or fluorenone.

10. The organic film composition according to claim 3, wherein (C) the aromatic ring containing resin comprises a resin (C3) that is obtained by polycondensation of one or two or more aromatic ring containing compounds with benzophenone, naphthophenone, or fluorenone.

11. The organic film composition according to claim 1, wherein (C) the aromatic ring containing resin comprises a resin (C1) that is obtained by polycondensation of any one or more compounds shown by the following general formulae (2a) and (2b) with a compound shown by the following general formula (3),

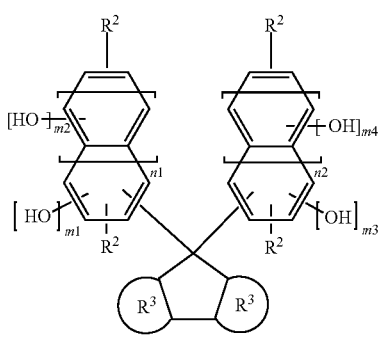

(2a)

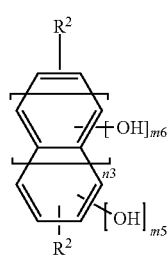

(2b)

wherein each of $R^2$ independently represents a hydrogen atom, or a saturated or unsaturated hydrocarbon group having 1 to 20 carbon atoms; each of $R^3$ independently represents a benzene ring or a naphthalene ring; each of m1+m2, m3+m4, and m5+m6 represents 1 or 2; each of n1, n2, and n3 represents 0 or 1,

A-CHO (3)

wherein A represents any of a hydrogen atom, a hydrocarbon group having 1 to 10 carbon atoms, and an optionally substituted aromatic hydrocarbon group having 6 to 20 carbon atoms.

12. The organic film composition according to claim 11, wherein (C) the aromatic ring containing resin comprises a resin (C2) that has one or more repeating units shown by the following general formula (4),

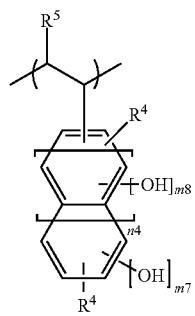

(4)

wherein each of $R^4$ independently represents a hydrogen atom, or a saturated or unsaturated hydrocarbon group having 1 to 20 carbon atoms; $R^5$ represents a hydrogen atom or may be bonded with one $R^4$ to form a ring; when $R^4$ and $R^5$ are bonded to form a ring, —$R^4$—$R^5$— represents a single bond or an alkylene group having 1 to 3 carbon atoms; m7+m8 represents 0, 1, or 2; and n4 represents 0 or 1.

13. The organic film composition according to claim 12, wherein (C) the aromatic ring containing resin comprises a resin (C3) that is obtained by polycondensation of one or two or more aromatic ring containing compounds with benzophenone, naphthophenone, or fluorenone.

14. The organic film composition according to claim 11, wherein (C) the aromatic ring containing resin comprises a resin (C3) that is obtained by polycondensation of one or two or more aromatic ring containing compounds with benzophenone, naphthophenone, or fluorenone.

15. The organic film composition according to claim 1, wherein (C) the aromatic ring containing resin comprises a resin (C2) that has one or more repeating units shown by the following general formula (4),

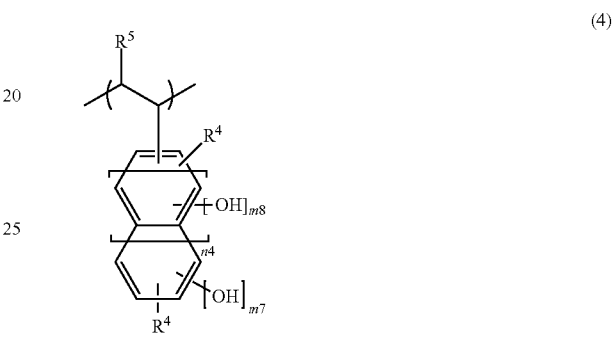

(4)

wherein each of $R^4$ independently represents a hydrogen atom, or a saturated or unsaturated hydrocarbon group having 1 to 20 carbon atoms; $R^5$ represents a hydrogen atom or may be bonded with one $R^4$ to form a ring; when $R^4$ and $R^5$ are bonded to form a ring, —$R^4$—$R^5$— represents a single bond or an alkylene group having 1 to 3 carbon atoms; m7+m8 represents 0, 1, or 2; and n4 represents 0 or 1.

16. The organic film composition according to claim 15, wherein (C) the aromatic ring containing resin comprises a resin (C3) that is obtained by polycondensation of one or two or more aromatic ring containing compounds with benzophenone, naphthophenone, or fluorenone.

17. The organic film composition according to claim 1, wherein (C) the aromatic ring containing resin comprises a resin (C3) that is obtained by polycondensation of one or two or more aromatic ring containing compounds with benzophenone, naphthophenone, or fluorenone.

18. The organic film composition according to claim 1, wherein the organic film composition further comprises at least one or more kinds selected from the group consisting of (D) a phenolic hydroxyl group containing compound, (E) an acid generator, (F) a crosslinking agent, and (G) a surfactant.

19. A patterning process on a substrate to be processed by a lithography, wherein, at least, a resist underlayer film is formed on a substrate to be processed by using the organic film composition according to claim 1, on this resist underlayer film is formed a resist middle layer film by using a resist middle layer film composition which contains a silicon atom, on this resist middle layer film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the resist middle layer film is etched by using the obtained resist pattern as an etching mask, the resist underlayer film is etched by using the obtained resist middle layer film pattern as an etching mask, and the substrate to be processed is etched by using the obtained resist underlayer film pattern as an etching mask, thereby forming a pattern on the substrate to be processed.

20. The patterning process according to claim 19, wherein the etching of the resist underlayer film by using the obtained resist middle layer film pattern as an etching mask is carried out by using an etching gas mainly comprising an oxygen gas or a hydrogen gas.

21. The patterning process according to claim 19, wherein a substrate having a structural body with a height of 30 nm or more or with different levels is used as the substrate to be processed.

22. A patterning process on a substrate to be processed by a lithography, wherein, at least, a resist underlayer film is formed on a substrate to be processed by using the organic film composition according to claim 1, on this resist underlayer film is formed any inorganic hard mask middle layer film selected from a silicon oxide film, a silicon nitride film, and a silicon oxynitride film, on this inorganic hard mask middle layer film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the inorganic hard mask middle layer film is etched by using the obtained resist pattern as an etching mask, the resist underlayer film is etched by using the obtained inorganic hard mask middle layer film pattern as an etching mask, and the substrate to be processed is etched by using the obtained resist underlayer film pattern as an etching mask, thereby forming a pattern on the substrate to be processed.

23. The patterning process according to claim 22, wherein the inorganic hard mask middle layer film is formed by a CVD method or an ALD method.

24. The patterning process according to claim 22, wherein a substrate having a structural body with a height of 30 nm or more or with different levels is used as the substrate to be processed.

25. A patterning process on a substrate to be processed by a lithography, wherein, at least, a resist underlayer film is formed on a substrate to be processed by using the organic film composition according to claim 1, on this resist underlayer film is formed any inorganic hard mask middle layer film selected from a silicon oxide film, a silicon nitride film, and a silicon oxynitride film, on this inorganic hard mask middle layer film is formed an organic anti-reflective film is formed, on this organic anti-reflective film is formed a resist upper layer film by using a resist upper layer film composition which is a photoresist composition, thereby forming a multilayer resist film; and then, after a pattern circuit area of the resist upper layer film is exposed, development thereof is carried out by using a developer to form a resist pattern on the resist upper layer film, the organic anti-reflective film and the inorganic hard mask middle layer film are etched by using the obtained resist pattern as an etching mask, the resist underlayer film is etched by using the obtained inorganic hard mask middle layer film pattern as an etching mask, and the substrate to be processed is etched by using the obtained resist underlayer film pattern as an etching mask, thereby forming a pattern on the substrate to be processed.

26. The patterning process according to claim 25, wherein the inorganic hard mask middle layer film is formed by a CVD method or an ALD method.

27. The patterning process according to claim 25, wherein a substrate having a structural body with a height of 30 nm or more or with different levels is used as the substrate to be processed.

* * * * *